(12) United States Patent
Griffin et al.

(10) Patent No.: US 11,133,823 B2
(45) Date of Patent: Sep. 28, 2021

(54) QUANTUM COMPRESSION SERVICE USING SUPERDENSE ENCODING

(71) Applicant: Red Hat, Inc., Raleigh, NC (US)

(72) Inventors: Leigh Griffin, Waterford (IE); Stephen Coady, Waterford (IE)

(73) Assignee: Red Hat, Inc., Raleigh, NC (US)

( * ) Notice: Subject to any disclaimer, the term of this patent is extended or adjusted under 35 U.S.C. 154(b) by 315 days.

(21) Appl. No.: 16/413,838

(22) Filed: May 16, 2019

(65) Prior Publication Data
US 2020/0366316 A1    Nov. 19, 2020

(51) Int. Cl.
| | |
|---|---|
| H03M 7/30 | (2006.01) |
| H03K 19/20 | (2006.01) |
| G06N 10/00 | (2019.01) |
| G06F 16/174 | (2019.01) |
| H03K 19/195 | (2006.01) |

(52) U.S. Cl.
CPC .......... *H03M 7/70* (2013.01); *G06F 16/1744* (2019.01); *G06N 10/00* (2019.01); *H03K 19/195* (2013.01); *H03K 19/20* (2013.01)

(58) Field of Classification Search
CPC ........ H03M 7/70; H03M 7/6029; H03M 7/30; H03K 19/20; H03K 19/195; G06N 10/00; G06F 16/1744
USPC .......................................................... 707/693
See application file for complete search history.

(56) References Cited

U.S. PATENT DOCUMENTS

| | | | |
|---|---|---|---|
| 9,275,011 B2 | 3/2016 | Svore et al. | |
| 9,413,470 B1 | 8/2016 | Smith et al. | |
| 2009/0015447 A1* | 1/2009 | Kilbank | G06N 10/00 341/60 |
| 2013/0208894 A1* | 8/2013 | Bovino | H04L 9/0852 380/278 |
| 2017/0026288 A1 | 1/2017 | Yang et al. | |
| 2018/0276555 A1 | 9/2018 | Weichenberger | |
| 2018/0330264 A1 | 11/2018 | Lanting et al. | |
| 2019/0018912 A1 | 1/2019 | Mosca et al. | |
| 2019/0065788 A1* | 2/2019 | Vijayasankar | H04L 63/0428 |

(Continued)

OTHER PUBLICATIONS

Notice of Allowance for U.S. Appl. No. 16/391,819, dated Apr. 20, 2020, 9 pages.

(Continued)

*Primary Examiner* — Don P Le
(74) *Attorney, Agent, or Firm* — Withrow & Terranova, PLLC

(57) ABSTRACT

Quantum compression using quantum communication driver (QCD) computing devices employing superdense encoding of conventionally compressed files is disclosed. In one example, a first QCD computing device receives a compressed file that was compressed using conventional compression formats by a computing device. The first QCD computing device performs superdense encoding of the compressed file using one or more first qubits that are each in an entangled state with a corresponding one or more second qubits of a second QCD computing device. The first qubit(s) are then sent to the second QCD computing device. In some examples, the second QCD computing device generates a sequential qubit mapping that represents a sequence in which the one or more first qubits encode the compressed file, and stores the first qubit(s) in association with the sequential qubit mapping.

20 Claims, 20 Drawing Sheets

(56) References Cited

U.S. PATENT DOCUMENTS

| | | | | |
|---|---|---|---|---|
| 2020/0052714 A1* | 2/2020 | Kamal | | G06N 5/046 |
| 2020/0118025 A1* | 4/2020 | Romero | | G06N 10/00 |
| 2020/0119748 A1* | 4/2020 | Lucarelli | | H03M 13/616 |
| 2020/0167278 A1* | 5/2020 | Gunnels | | G06F 12/0802 |
| 2020/0389299 A1* | 12/2020 | White | | H04B 10/85 |
| 2020/0401927 A1* | 12/2020 | Nickerson | | H03M 13/29 |
| 2021/0042652 A1* | 2/2021 | Das | | G06F 9/30145 |
| 2021/0124640 A1* | 4/2021 | Nickerson | | G06F 11/10 |
| 2021/0133614 A1* | 5/2021 | Ashrafi | | G02F 3/00 |

OTHER PUBLICATIONS

Author Unknown, "QSIT10.L04," accessed Feb. 22, 2019 from https://qudev.phys.ethz.ch/content/QSIT16/QSIT16_V03_slides.pdf, 21 pages.
Cortese, John, et al., "Loading Classical Data into a Quantum Computer," Lincoln Laboratory, Mar. 5, 2018, Massachusetts Intstitute of Technology, 28 pages.
Li, Yaqiao, "Superdense Coding and Quantum Teleportation," Apr. 7, 2017, McGill University, 6 pages.
Ozols, Maris, "Quantum Information Processing Protocols," Quantum Computing, Lecture 5, cl.cam.ac.uk/teaching/1617/QuantComp/slides5.pdf, accessed Feb. 22, 2019, 10 pages.
Panigrahi, Prasanta, et al., "Teleportation, Quantum Information Splitting and Dense Coding through Cluster Brown States," International School and Conference on Quantum Information, Mar. 2008, 41 pages.
Wilde, Mark, et al., "Focus: Saving Space with Quantum Information," Physics Review Letters, vol. 7, Issue 106, Oct. 17, 2014, 4 pages.

* cited by examiner

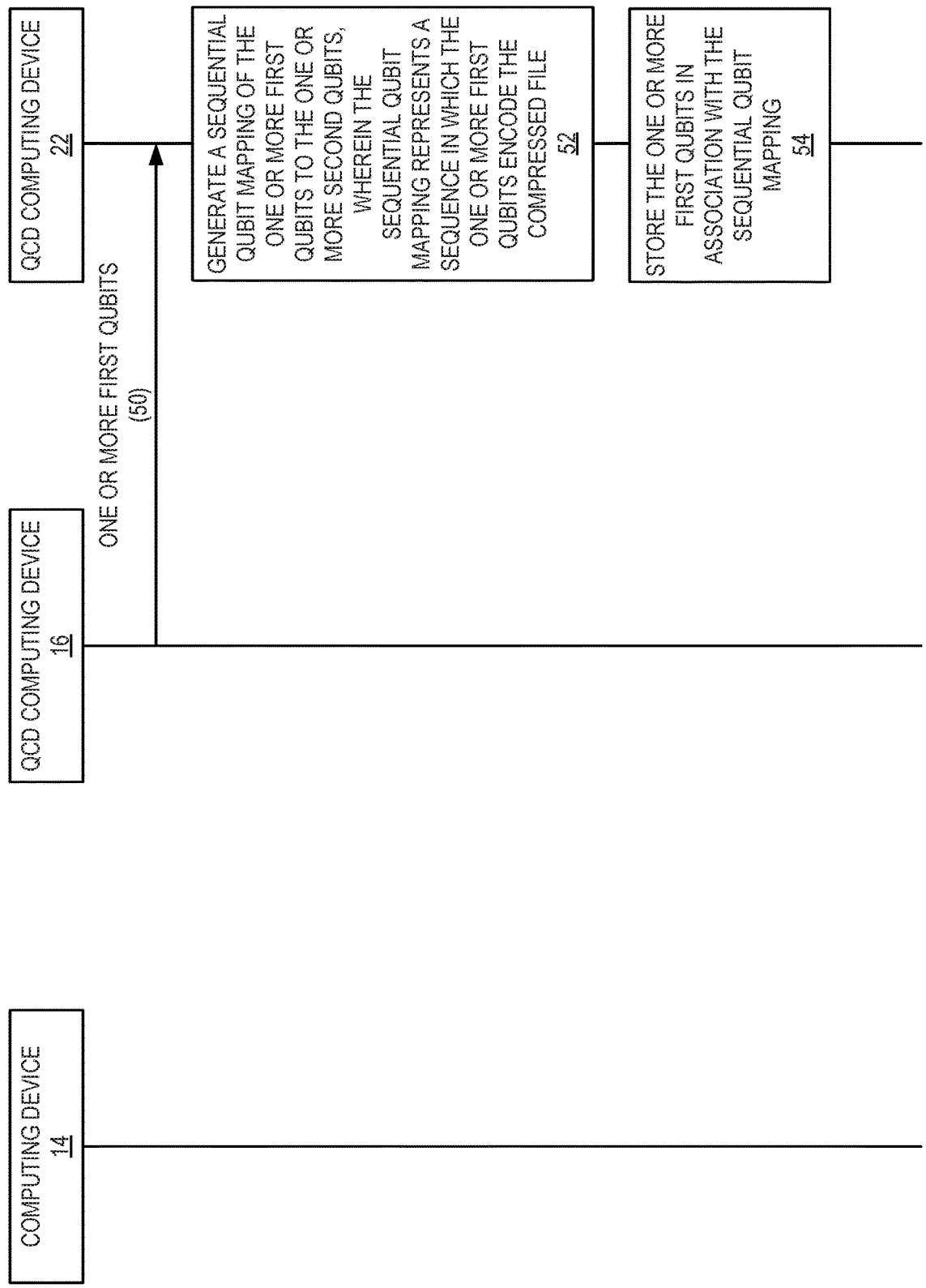

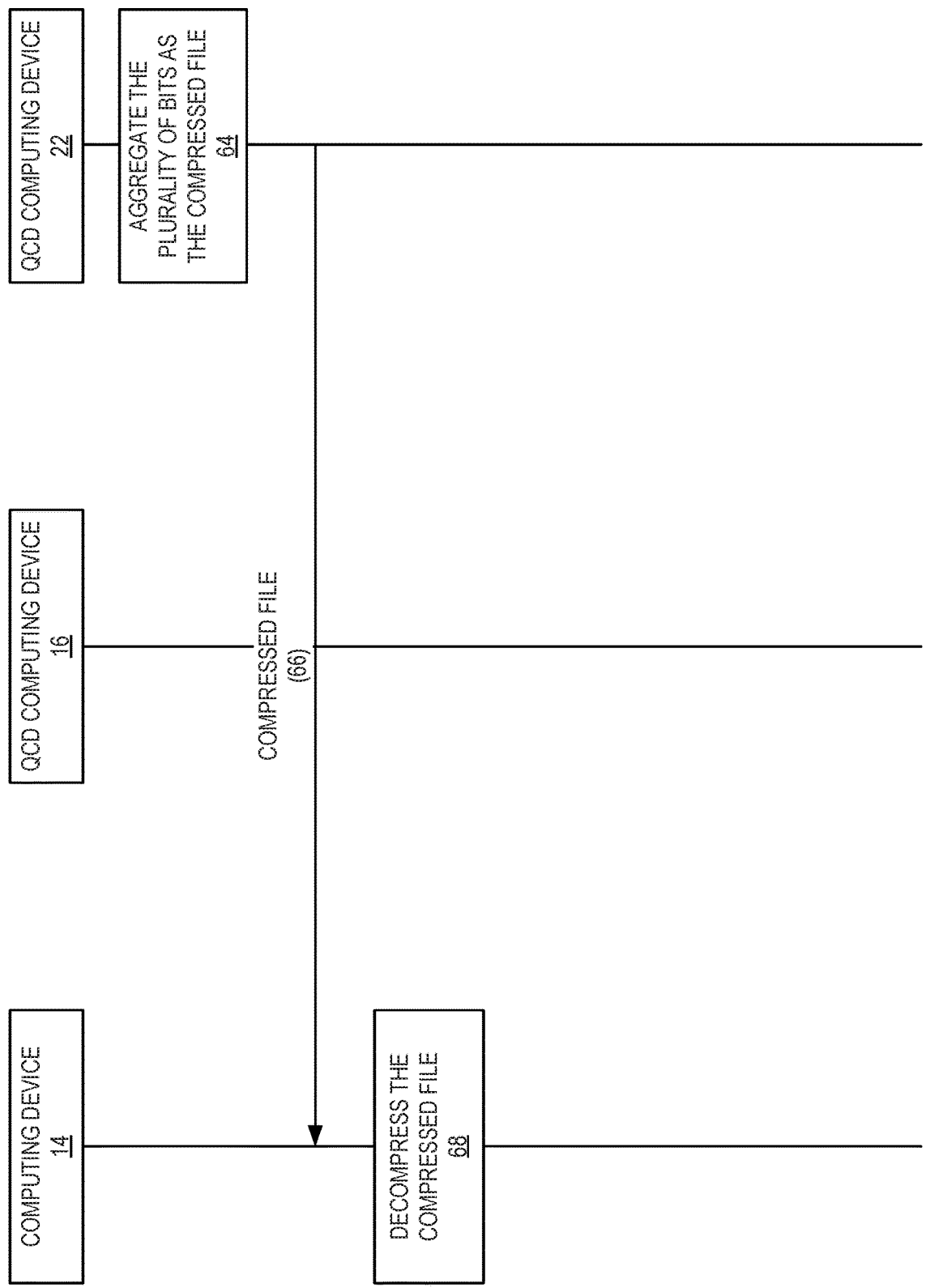

QUANTUM COMPRESSION SERVICE USING SUPERDENSE ENCODING

BACKGROUND

Quantum computing involves the use of quantum bits, referred to herein as "qubits," which have characteristics that differ from those of classical (i.e., non-quantum) bits used in classical computing. For example, while a classical bit may be in a state of either one (1) or zero (0), a qubit may be in a "superposition" of both states simultaneously. A pair of qubits may also experience a physical phenomenon referred to as "entanglement," in which the quantum state of each qubit cannot be described independently of the state of the other qubit. Classical computing has no corollaries to superposition or entanglement.

SUMMARY

The examples disclosed herein relate to quantum compression using quantum communication driver (QCD) computing devices employing superdense encoding of conventionally compressed files. In one example, a first QCD computing device receives a compressed file that was compressed using a conventional compression format by a computing device (i.e., a classical computing device). The first QCD computing device performs superdense encoding of the compressed file using one or more first qubits that are each in an entangled state with a corresponding one or more second qubits of a second QCD computing device. The first qubit(s) are then sent to the second QCD computing device, which generates a sequential qubit mapping that maps the first qubit(s) to the second qubit(s), and also represents a sequence in which the one or more first qubits encode the compressed file. The second QCD computing device then stores the first qubit(s) in association with the sequential qubit mapping. In this manner, the first qubit(s) used in the superdense encoding of the compressed file may be stored by the second QCD computing device using half of the additional storage space that would be required to store the compressed file.

In another example, a method is provided. The method comprises receiving, by a first QCD computing device, a compressed file from a computing device. The method further comprises performing, by the first QCD computing device, superdense encoding of the compressed file using one or more first qubits that are each in an entangled state with a corresponding one or more second qubits of a second QCD computing device. The method also comprises sending the one or more first qubits via a communications network to the second QCD computing device for storage.

In another example, a method is provided. The method comprises receiving, by a second QCD computing device, one or more first qubits from a first QCD computing device via a communications network, wherein the one or more first qubits are each in an entangled state with a corresponding one or more second qubits of the second QCD computing device, and the one or more first qubits represent a superdense encoding of a compressed file. The method further comprises generating, by the second QCD computing device, a sequential qubit mapping of the one or more first qubits to the one or more second qubits, wherein the sequential qubit mapping represents a sequence in which the one or more first qubits encode the compressed file. The method also comprises storing, by the second QCD computing device, the one or more first qubits in association with the sequential qubit mapping.

In another example, a computing system is provided. The computing system comprises a computing device that includes a system memory and a processor device coupled to the system memory. The computing system further comprises a first QCD computing device that includes a system memory, and a quantum processor device coupled to the system memory and implementing one or more first qubits. The quantum processor device is to receive a compressed file from the computing device. The quantum processor device is further to perform superdense encoding of the compressed file using the one or more first qubits that are each in an entangled state with a corresponding one or more second qubits of a second QCD computing device. The quantum processor device is also to send the one or more first qubits via a communications network to the second QCD computing device for storage.

Individuals will appreciate the scope of the disclosure and realize additional aspects thereof after reading the following detailed description of the examples in association with the accompanying drawing figures.

BRIEF DESCRIPTION OF THE DRAWINGS

The accompanying drawing figures incorporated in and forming a part of this specification illustrate several aspects of the disclosure and, together with the description, serve to explain the principles of the disclosure.

FIGS. 2A-2D are messaging diagrams illustrating communication flows among elements of the computing system of FIG. 1 for performing quantum compression, according to one example;

DETAILED DESCRIPTION

Figure 1:
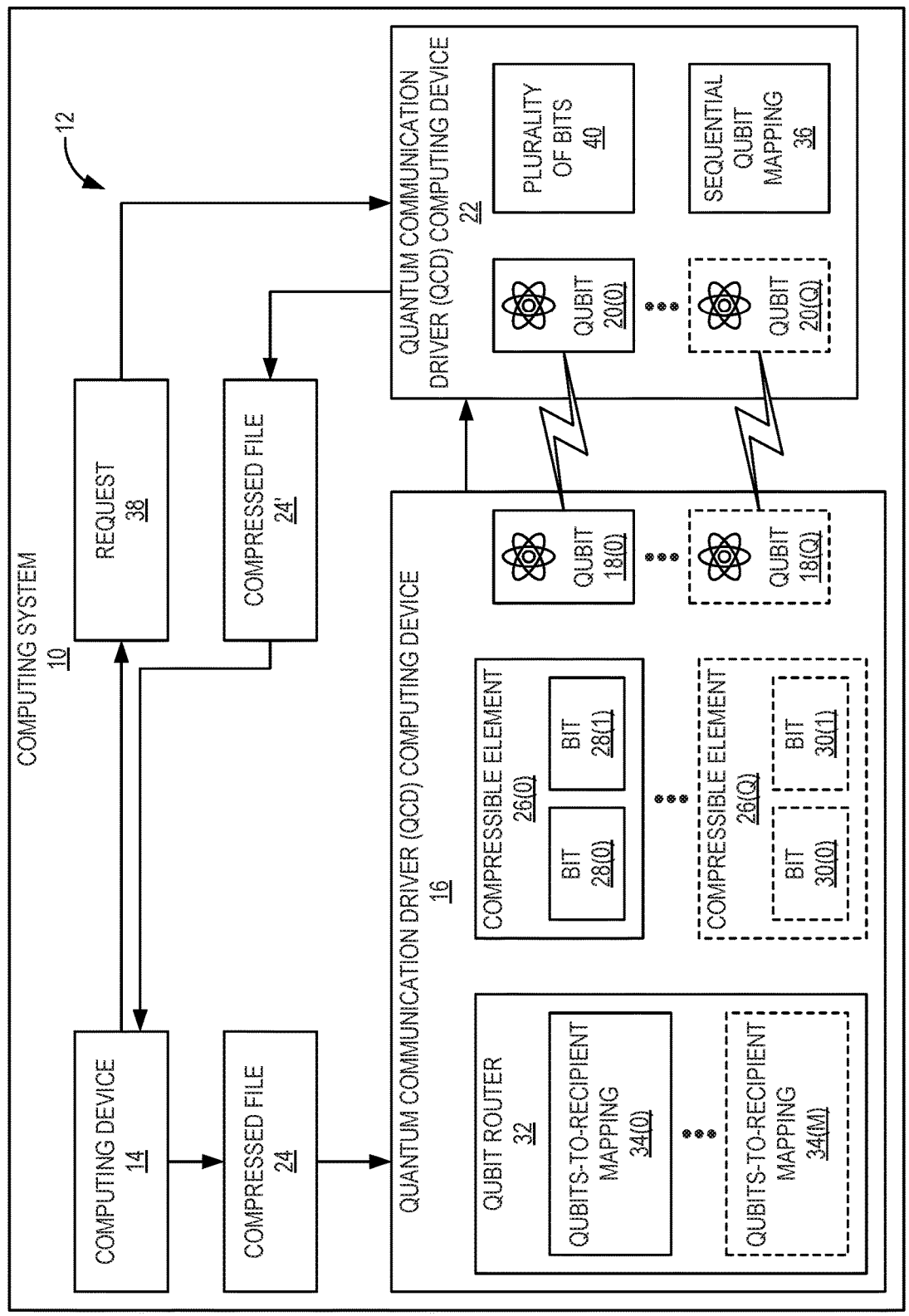
FIG. 1 is a block diagram of a computing system in which examples may be practiced.

The examples set forth below represent the information to enable individuals to practice the examples and illustrate the best mode of practicing the examples. Upon reading the following description in light of the accompanying drawing figures, individuals will understand the concepts of the disclosure and will recognize applications of these concepts not particularly addressed herein. It should be understood that these concepts and applications fall within the scope of the disclosure and the accompanying claims.

Any flowcharts discussed herein are necessarily discussed in some sequence for purposes of illustration, but unless otherwise explicitly indicated, the examples are not limited to any particular sequence of steps. The use herein of ordinals in conjunction with an element is solely for distinguishing what might otherwise be similar or identical labels, such as "first message" and "second message," and does not imply a priority, a type, an importance, or other attribute, unless otherwise stated herein. The term "about" used herein in conjunction with a numeric value means any value that is within a range of ten percent greater than or ten percent less than the numeric value. As used herein and in the claims, the articles "a" and "an" in reference to an element refers to "one or more" of the element unless otherwise explicitly specified. The word "or" as used herein and in the claims is inclusive unless contextually impossible. As an example, the recitation of A or B means A, or B, or both A and B.

As discussed above, quantum computing involves the use of quantum bits, referred to herein as "qubits," which have characteristics that differ from those of classical (i.e., non-quantum) bits used in classical computing. For example, while a classical bit may be in a state of either one (1) or zero (0), a qubit may be in a "superposition" of both states simultaneously. A pair of qubits may also experience a physical phenomenon referred to as "entanglement," in which the quantum state of each qubit cannot be described independently of the state of the other qubit. Classical computing has no corollaries to superposition or entanglement.

The phenomenon of entanglement underlies a quantum communication protocol known as "superdense encoding," which allows two classical bits of information to be transmitted from a sender to a recipient by sending only one qubit from the sender to the recipient. To use superdense encoding, the sender and the recipient each must first be in possession of one qubit of a pair of entangled qubits. The sender can then encode two classical bits of information by manipulating the sender's entangled qubit (i.e., by performing a quantum gate operation such as a bit flip operation and/or a phase flip operation, as non-limiting examples), which allows the sender to prearrange the result of the recipient's measurement of the pair of entangled qubits. After the sender sends the entangled qubit to the recipient, the recipient can then perform measurements on the pair of entangled qubits to decode the two classical bits of information.

Superdense encoding can be leveraged to decrease the number of data bits transmitted via a communications network by half, and further to decrease the storage footprint of the encoded data. However, the operating environment of current quantum computing devices poses challenges to the widespread use of superdense encoding. For example, to prevent quantum decoherence of the qubits, a quantum computing device may require isolation from the external world, and may also require extremely low operating temperatures (e.g., as low as 20 millikelvins).

In this regard, the examples herein relate to quantum compression using quantum communication driver (QCD) computing devices employing superdense encoding of conventionally compressed files. In some examples, a first QCD computing device receives a compressed file from a computing device (i.e., a classical computing device). The compressed file, according to some examples, was compressed by the computing device using a conventional compression format. The first QCD computing device performs superdense encoding of the compressed file using one or more first qubits that are each in an entangled state with a corresponding one or more second qubits of a second QCD computing device. The first qubit(s) are then sent to the second QCD computing device. According to some examples, the second QCD computing device, after receiving the first qubit(s), generates a sequential qubit mapping that represents a sequence in which the one or more first qubits encode the compressed file. The second QCD computing device then stores the first qubit(s) and the sequential qubit mapping. In this manner, the first qubit(s) used in the superdense encoding of the compressed file may be stored by the second QCD computing device using half of the additional storage space that would be required to store the compressed file.

FIG. 1 is a block diagram of a computing system 10 in which examples may be practiced. The computing system 10 includes a communications network 12, through which a computing device 14 is communicatively coupled to a QCD computing device 16. In the example of FIG. 1, the computing device 14 is a classical computing device, while the QCD computing device 16 is a quantum computing device. The QCD computing device 16 maintains a set of one or more first qubits 18(0)-18(Q), which are in a state of entanglement with a set of one or more second qubits 20(0)-20(Q) that are maintained by a QCD computing device 22 (i.e., another quantum computing device) communicatively coupled to the QCD computing device 16. According to some examples, prior to the computing system 10 performing quantum compression, the QCD computing device 16 may induce an entangled state between each qubit of the one or more first qubits 18(0)-18(Q) and a corresponding qubit of the one or more second qubits 20(0)-20(Q), and then send the one or more second qubits 20(0)-20(Q) to the QCD computing device 22. Inducing the entangled state between the one or more first qubits 18(0)-18(Q) and the one or more second qubits 20(0)-20(Q) may be performed, e.g., using Quantum Assembly (QASM) files to apply a Hadamard gate to each of the one or more first qubits 18(0)-18(Q) to place them a state of superposition, and then apply a CNOT gate to each of the one or more second qubits 20(0)-20(Q), as a non-limiting example. Likewise, qubits such as the one or more first qubits 18(0)-18(Q) and the one or more second qubits 20(0)-20(Q) may be sent from the QCD computing device 16 to the QCD computing device 22 in the form of photons transmitted via fiber optic cabling or through free space using pulsed lasers, as non-limiting examples.

The computing device 14 of the computing system 10 of FIG. 1 generates a compressed file 24 by compressing data (not shown) using one or more conventional compression formats such as 7Z, TAR.BZ2, TAR.GZ, RAR, or ZIP formats, as non-limiting examples. To achieve further compression, the computing device 14 sends the compressed file 24 to the QCD computing device 16 for superdense encoding. In some examples, the QCD computing device 16 may perform superdense encoding by first dividing the compressed file 24 into one or more compressible elements 26(0)-26(Q) of two classical bits each. In the example of FIG. 1, the compressible element 26(0) includes bits 28(0)-28(1), while the compressible element 26(Q) includes bits 30(0)-30(1). Each of the compressible elements 26(0)-26(Q) corresponds to one of the first qubits 18(0)-18(Q) used to perform the superdense encoding.

Some examples may provide that the QCD computing device 16 is communicatively coupled to multiple QCD computing devices 22, and accordingly, the QCD computing device 16 may maintain a corresponding plurality of sets of qubits that are in an entangled state with sets of qubits maintained by the QCD computing devices 22. The QCD computing device 16 thus may include a qubit router 32 that maintains one or more qubits-to-recipient mappings 34(0)-34(M). Each qubits-to-recipient mapping 34(0)-34(M) associates a set of qubits maintained by the QCD computing device 16, such as the one or more first qubits 18(0)-18(Q), with a corresponding QCD computing device maintaining a corresponding set of entangled qubits (e.g., the QCD computing device 22 and the one or more second qubits 20(0)-20(Q)). In such examples, operations for performing the superdense encoding of the compressed file 24 may include accessing the one or more qubits-to-recipient mappings 34(0)-34(M), and identifying the one or more first qubits 18(0)-18(Q) based on a qubits-to-recipient mapping of the one or more qubits-to-recipient mappings 34(0)-34(M). Superdense encoding may then be performed (e.g., by transforming a Bell state of a corresponding qubit of the one or more first qubits 18(0)-18(Q), as a non-limiting example).

After performing the superdense encoding, the QCD computing device 16 sends the one or more first qubits 18(0)-18(Q) to the QCD computing device 22. In some examples, upon receiving the one or more first qubits 18(0)-18(Q) from the QCD computing device 16, the QCD computing device 22 generates a sequential qubit mapping 36 based on the received first qubit(s) 18(0)-18(Q). The sequential qubit mapping 36 maps the first qubit(s) 18(0)-18(Q) to the corresponding second qubit(s) 20(0)-20(Q), and also represents a sequence in which the one or more first qubits 18(0)-18(Q) encode the compressed file 24. The sequential qubit mapping 36 may be generated based on, for example, the order in which the first qubit(s) 18(0)-18(Q) are received by the QCD computing device 22, and may be implemented as an ordered table or list, or other appropriate data structure. The QCD computing device 22 may then store the one or more first qubits 18(0)-18(Q) in association with the sequential qubit mapping 36. In some examples, the QCD computing device 22 may store the one or more first qubits 18(0)-18(Q) in a conventional data storage (not shown) suitable for storing qubits, or may store an indication that the one or more first qubits 18(0)-18(Q) are deallocated and unavailable for use by other running services.

Subsequently, the QCD computing device 22 may receive a request 38 from the computing device 14 for the super-dense-encoded compressed file 24 stored by the QCD computing device 22. The request 38 may comprise a unique identifier corresponding to the compressed file 24. In response to receiving the request 38, the QCD computing device 22 may retrieve the sequential qubit mapping 36 corresponding to the compressed file 24, and may also retrieve the one or more first qubits 18(0)-18(Q) representing the superdense encoding of the compressed file 24. Using the one or more first qubits 18(0)-18(Q) and the corresponding one or more second qubits 20(0)-20(Q), the QCD computing device 22 then decodes a plurality of bits 40 based on the sequential qubit mapping 36. In some examples, decoding the plurality of bits 40 may include ordering the one or more first qubits 18(0)-18(Q) into a sequence indicated by the sequential qubit mapping 36, and then performing a CNOT operation on each qubit of the one or more first qubits 18(0)-18(Q) and a corresponding qubit of the one or more second qubits 20(0)-20(Q). The plurality of bits 40 thus decoded are then aggregated into the compressed file 24', which is then sent by the QCD computing device 22 to the computing device 14 via the communications network 12. It is to be understood that the compressed file 24' is a separate instantiation of the original compressed file 24, but otherwise is identical to the compressed file 24. Upon receiving the compressed file 24' from the QCD computing device 22, the computing device 14 may decompress the compressed file 24' (e.g., using a conventional compression format such as 7Z, TAR.BZ2, TAR.GZ, RAR, or ZIP formats, and the like, as non-limiting examples).

FIGS. 2A-2D illustrate communication flows among elements of the computing system 10 of FIG. 1 for providing quantum compression, according to one example. Elements of FIG. 1 are referenced in describing FIGS. 2A-2D for the sake of clarity. As seen in FIGS. 2A-2D, each of the computing device 14, the QCD computing device 16, and the QCD computing device 22 are represented by vertical lines, with communications between these elements illustrated by captioned arrows, and operations performed by each element illustrated by captioned boxes.

Figure 2A:
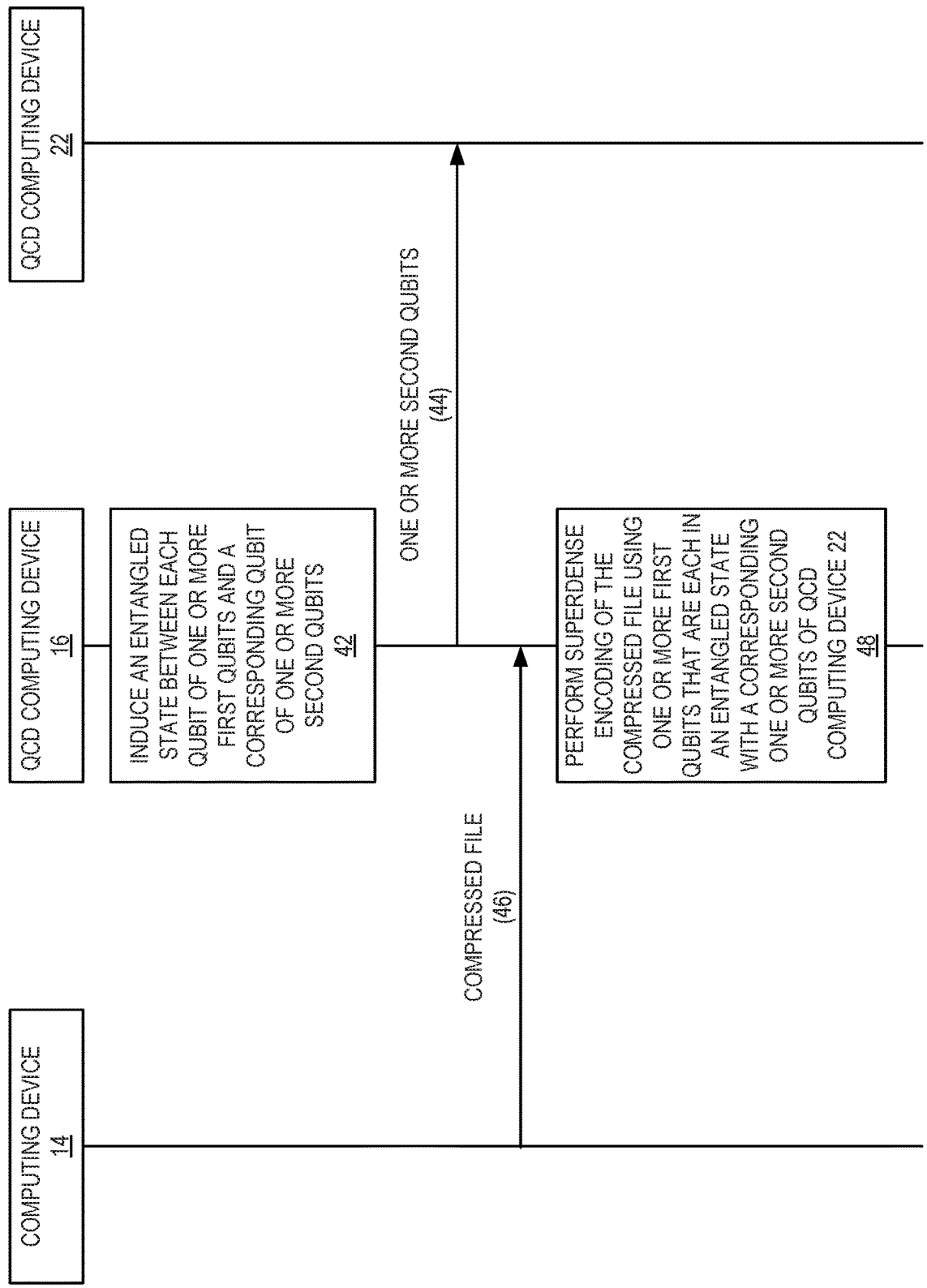

In the example of FIG. 2A, operations according to some examples begin with the QCD computing device 16 inducing an entangled state between each qubit of one or more first qubits 18(0)-18(Q) and a corresponding qubit of one or more second qubits 20(0)-20(Q), as indicated by block 42. The QCD computing device 16 then sends the one or more second qubits 20(0)-20(Q) to the QCD computing device 22, as indicated by arrow 44. The QCD computing device 16 next receives the compressed file 24 from the computing device 14, as indicated by arrow 46. The QCD computing device 16 then performs superdense encoding of the compressed file 24 using the one or more first qubits 18(0)-18(Q) that are each in an entangled state with the corresponding one or more second qubits 20(0)-20(Q), as indicated by box 48. Processing then continues in FIG. 2B.

Referring now to FIG. 2B, the QCD computing device 16 sends the one or more first qubits 18(0)-18(Q) to the QCD computing device 22, as indicated by arrow 50. The QCD computing device 22 generates the sequential qubit mapping 36, wherein the sequential qubit mapping 36 represents a sequence in which the one or more first qubits 18(0)-18(Q) encode the compressed file 24, as indicated by block 52. The QCD computing device 22 then stores the one or more first qubits 18(0)-18(Q) in association with the sequential qubit mapping 36, as indicated by block 54. Processing then continues in FIG. 2C.

Figure 2C:
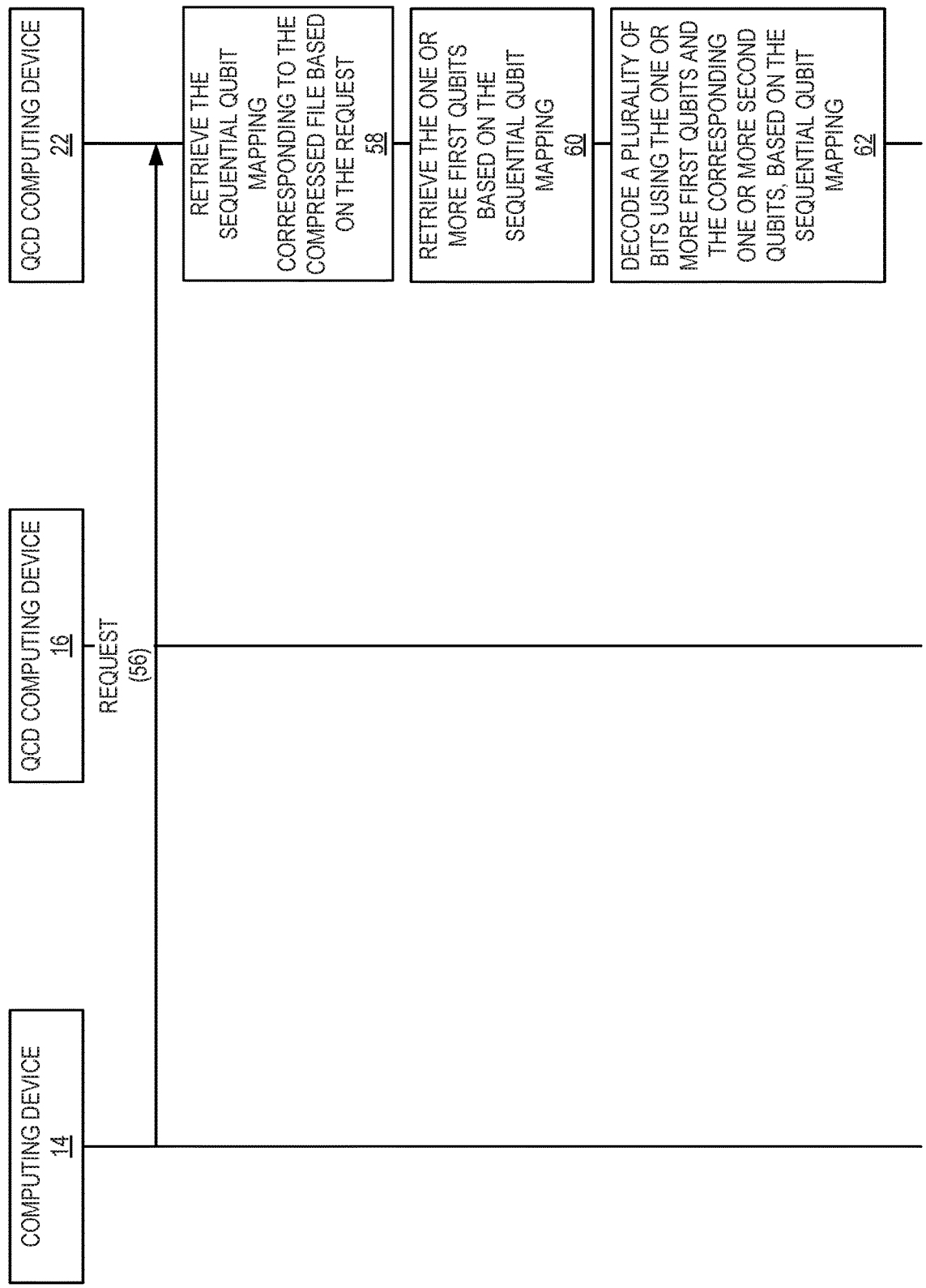

Turning now to FIG. 2C, the QCD computing device 22 receives a request 38 for the compressed file 24 from the computing device 14, as indicated by arrow 56. The QCD computing device 22 retrieves the sequential qubit mapping 36 corresponding to the compressed file 24 based on the request 38, as indicated by box 58. The QCD computing device 22 then retrieves the one or more first qubits 18(0)-18(Q) based on the sequential qubit mapping 36, as indicated by box 60. The QCD computing device 22 next decodes the plurality of bits 40 using the one or more first qubits 18(0)-18(Q) and the corresponding one or more second qubits 20(0)-20(Q), based on the sequential qubit mapping 36, as indicated by box 62. Processing then continues in FIG. 2D.

As seen in FIG. 2D, the QCD computing device 22 aggregates the plurality of bits 40 as the compressed file 24', as indicated by block 64. The QCD computing device 22 then sends the compressed file 24' to the computing device 14, as indicated by arrow 66. Finally, the computing device 14 decompresses the compressed file 24', as indicated by box 68.

Figure 3A:
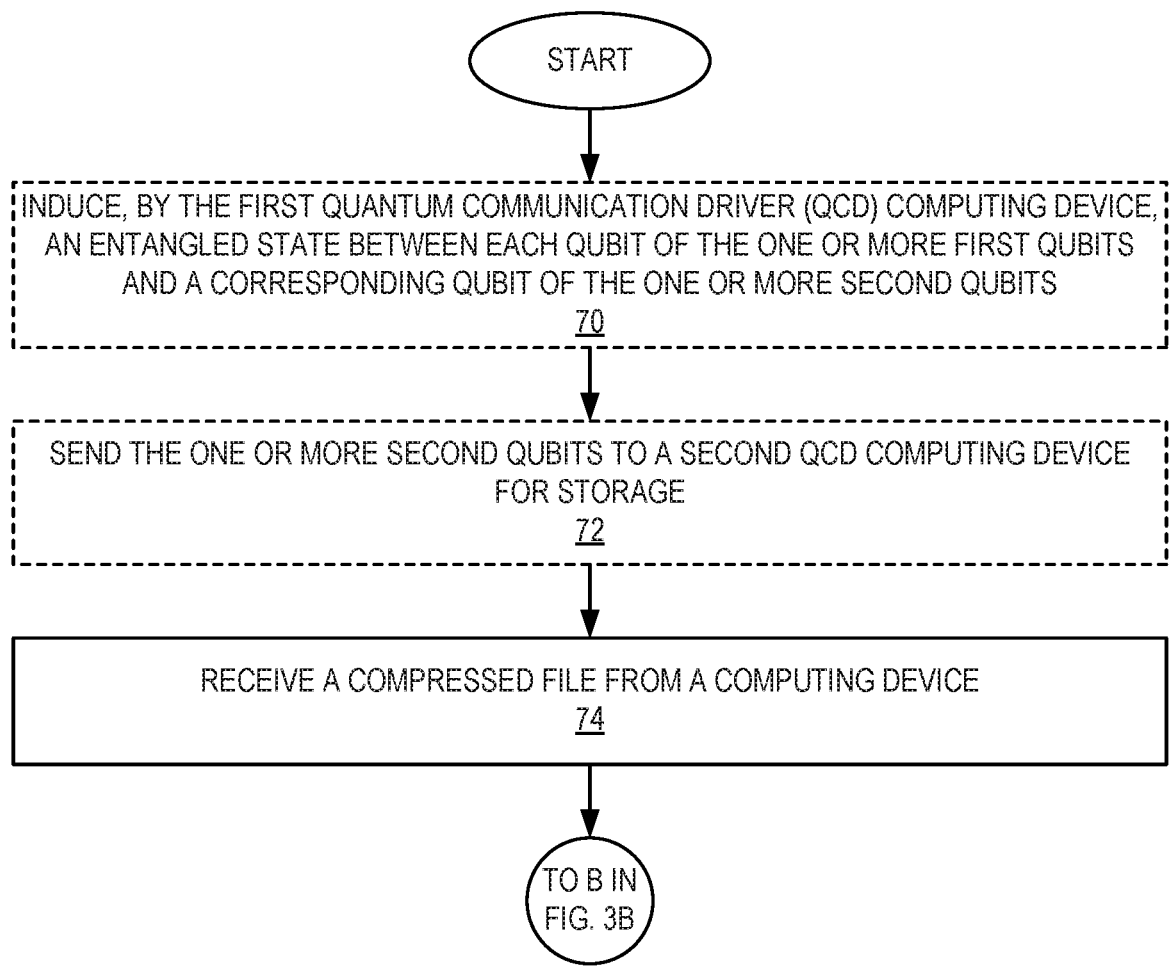
FIGS. 3A-3C are flowcharts illustrating operations for quantum compression by performing superdense encoding of a compressed file employing entangled qubits, according to one example.
Figure 3B:
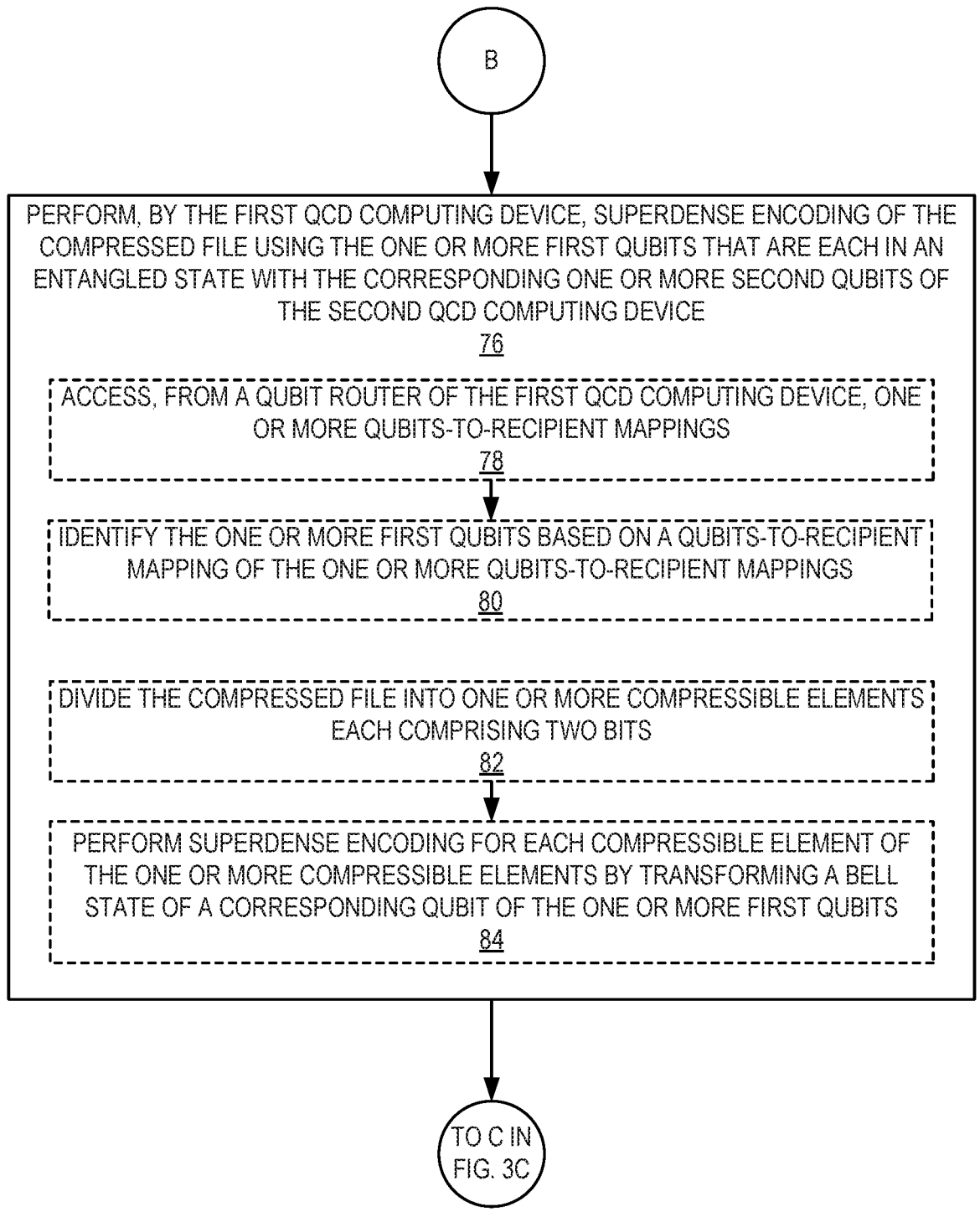
Figure 3C:
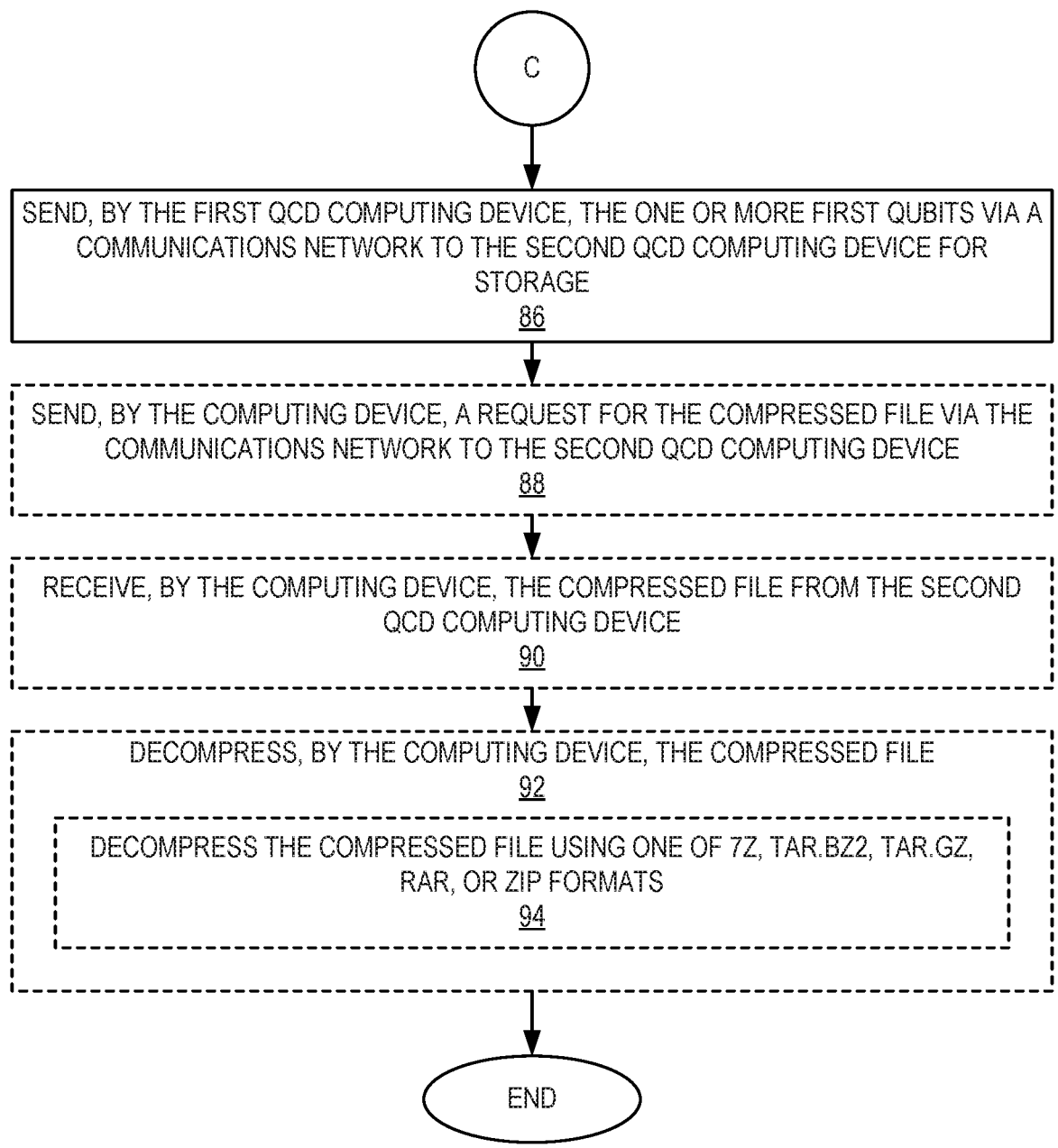

To illustrate operations for providing a quantum compression service by performing superdense encoding of a compressed file employing entangled qubits according to one example, FIGS. 3A-3C are provided. For the sake of clarity, elements of FIG. 1 are referenced in describing FIGS. 3A-3C. Operations in FIG. 3A begin in some examples with a first QCD computing device, such as the QCD computing device 16, inducing an entangled state between each qubit of the one or more first qubits 18(0)-18(Q) and a corresponding qubit of the one or more second qubits 20(0)-20(Q) (block 70). The first QCD computing device 16 may then send the one or more second qubits 20(0)-20(Q) to a second QCD computing device, such as the QCD computing device 22, for storage (block 72). The first QCD computing device 16 receives the compressed file 24 from a computing device 14 (block 74). Processing then continues at block 76 in FIG. 3B.

Referring now to FIG. 3B, the first QCD computing device 16 performs superdense encoding of the compressed file 24 using the one or more first qubits 18(0)-18(Q) that are each in an entangled state with the corresponding one or more second qubits 20(0)-20(Q) of the second QCD computing device 22 (block 76). In some examples, the operations of block 76 for performing superdense encoding of the compressed file 24 may include accessing, from a qubit router 32 of the first QCD computing device 16, one or more qubits-to-recipient mappings 34(0)-34(M) (block 78). The first QCD computing device 16 may then identify the one or more first qubits 18(0)-18(Q) based on a qubits-to-recipient mapping of the one or more qubits-to-recipient mappings 34(0)-34(M) (block 80). According to some examples, the operations of block 80 for performing superdense encoding of the compressed file 24 may include dividing the compressed file 24 into one or more compressible elements 26(0)-26(Q), each comprising two bits 28(0)-28(1), 30(0)-30(1) (block 82). The first QCD computing device 16 may next perform superdense encoding for each compressible element of the one or more compressible elements 26(0)-26(Q) by transforming a Bell state of a corresponding qubit of the one or more first qubits 18(0)-18(Q) (block 84). Processing then continues at block 86 in FIG. 3C.

Turning now to FIG. 3C, the first QCD computing device 16 sends the one or more first qubits 18(0)-18(Q) via the communications network 12 to the second QCD computing device 22 for storage (block 86). In some examples, the computing device 14 may subsequently send the request 38 for the compressed file 24 via the communications network 12 to the second QCD computing device 22 (block 88). The computing device 14 may receive the compressed file 24' from the second QCD computing device 22 (block 90). The computing device 14 then decompresses the compressed file 24' (block 92). In some examples the operations of block 92 for decompressing the compressed file 24' may include decompressing the compressed file using one of 7Z, TAR.BZ2, TAR.GZ, RAR, or ZIP formats (block 94).

Figure 4A:
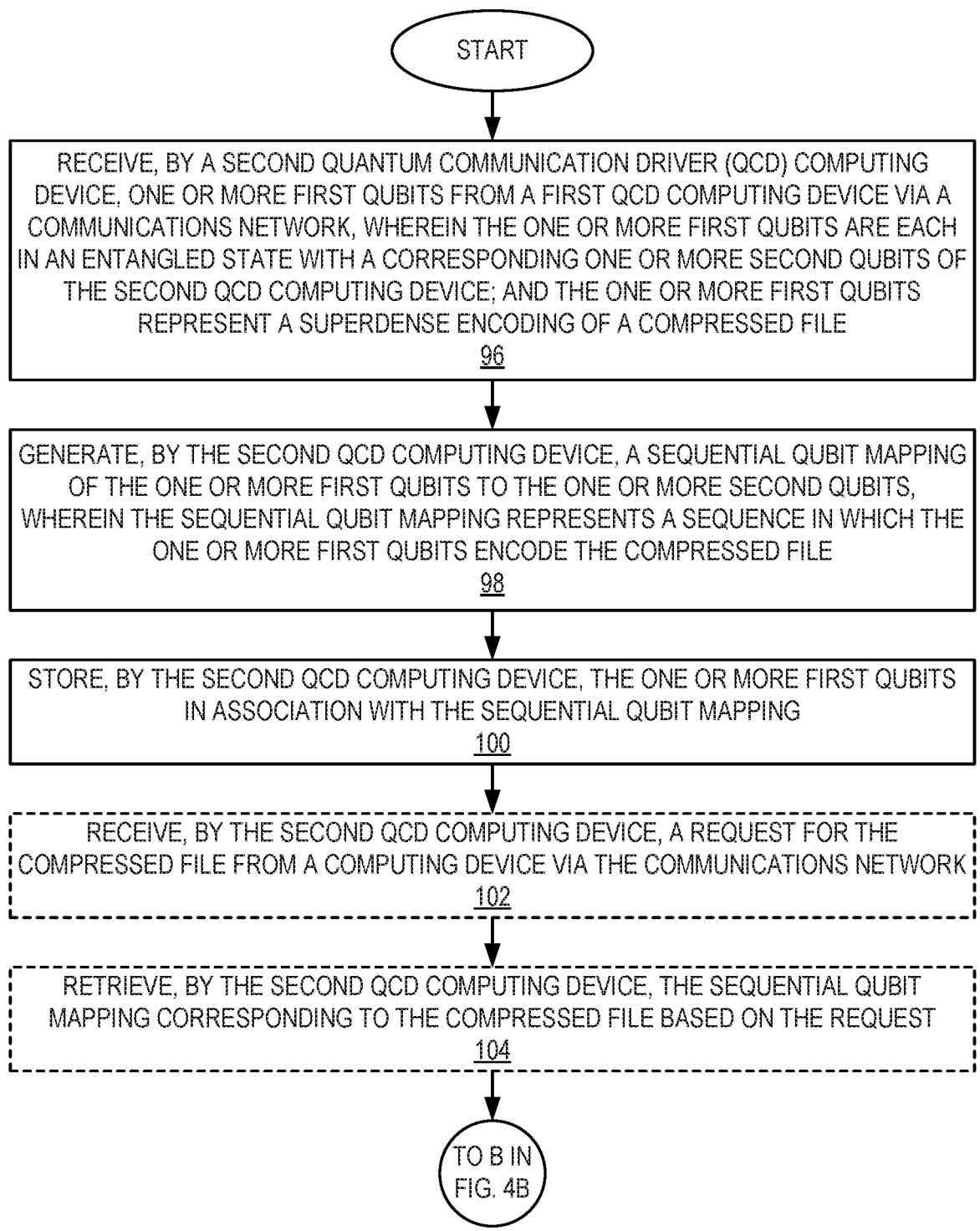
FIGS. 4A and 4B are flowcharts illustrating operations for generating a sequential qubit mapping of entangled qubits used for superdense encoding of a compressed file, and for decoding a requested compressed file, according to one example.
Figure 4B:
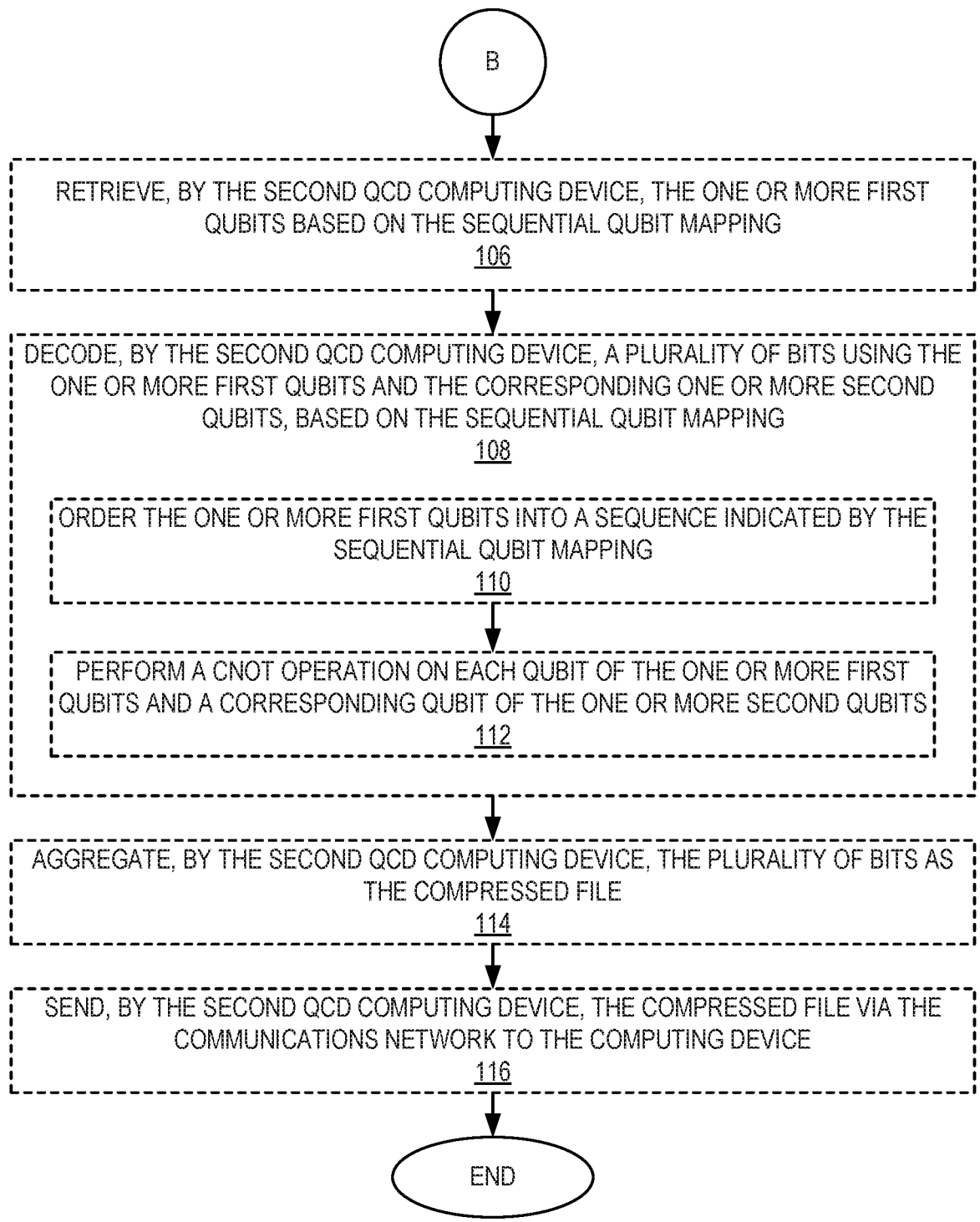

FIGS. 4A and 4B are flowcharts illustrating operations for generating a sequential qubit mapping of entangled qubits used for superdense encoding of a compressed file, and for decoding a requested compressed file, according to one example. Elements of FIG. 1 are referenced in describing FIGS. 4A and 4B for the sake of clarity. In FIG. 4A, operations begin with a second QCD computing device, such as the QCD computing device 22, receiving the one or more first qubits 18(0)-18(Q) from a first QCD computing device, such as the QCD computing device 16, via the communications network 12, wherein the one or more first qubits 18(0)-18(Q) are each in an entangled state with a corresponding one or more second qubits 20(0)-20(Q) of the second QCD computing device 22, and the one or more first qubits 18(0)-18(Q) represent a superdense encoding of the compressed file 24 (block 96). The second QCD computing device 22 generates the sequential qubit mapping 36 of the one or more first qubits 18(0)-18(Q) to the one or more second qubits 20(0)-20(Q), wherein the sequential qubit mapping 36 represents a sequence in which the one or more first qubits 18(0)-18(Q) encode the compressed file (block 98). The second QCD computing device 22 then stores the one or more first qubits 18(0)-18(Q) in association with the sequential qubit mapping 36 (block 100).

In some examples, the second QCD computing device 22 may subsequently receive the request 38 for the compressed file 24 from the computing device 14 via the communications network 12 (block 102). In response, the second QCD computing device 22 retrieves the sequential qubit mapping 36 corresponding to the compressed file 24 based on the request 38 (block 104). Processing then resumes at block 106 of FIG. 4B.

Referring now to FIG. 4B, the second QCD computing device 22 next retrieves the one or more first qubits 18(0)-18(Q) based on the sequential qubit mapping 36 (block 106). The second QCD computing device 22 then decodes a plurality of bits 40 using the one or more first qubits 18(0)-18(Q) and the corresponding one or more second qubits 20(0)-20(Q), based on the sequential qubit mapping 36 (block 108). According to some examples, the operations of block 108 for decoding the plurality of bits 40 may include ordering the one or more first qubits 18(0)-18(Q) into a sequence indicated by the sequential qubit mapping 36 (block 110). The second QCD computing device 22 may then perform a CNOT operation on each qubit of the one or more first qubits 18(0)-18(Q) and a corresponding qubit of the one or more second qubits 20(0)-20(Q) (block 112). The second QCD computing device 22 aggregates the plurality of bits 40 as the compressed file 24' (block 114). The second QCD computing device 22 then sends the compressed file 24' via the communications network 12 to the computing device 14 (block 116).

Figure 5:
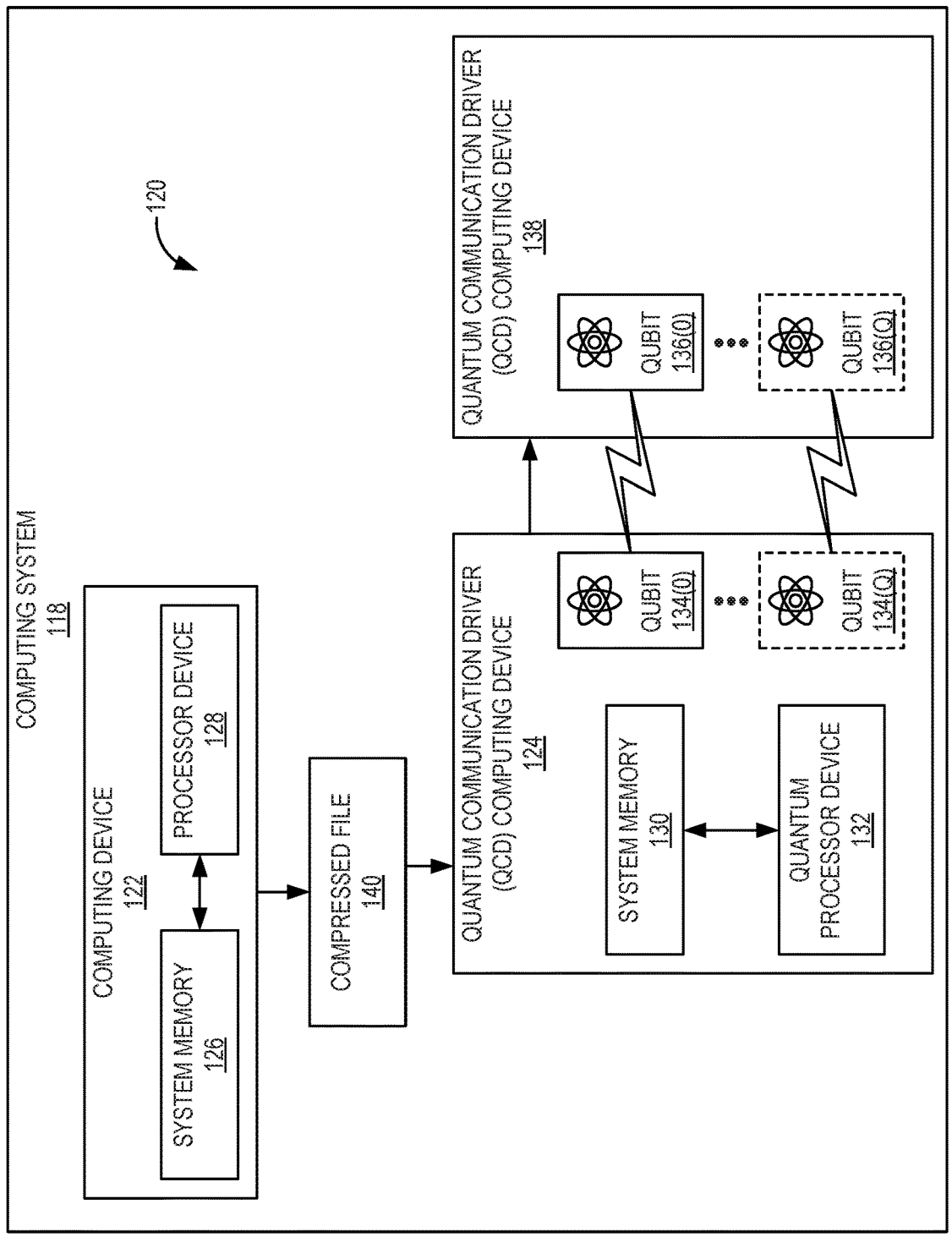
FIG. 5 is a simpler block diagram of the computing system of FIG. 1 for providing a quantum compression service, according to one example.

FIG. 5 is a simpler block diagram of the computing system 10 of FIG. 1 for providing quantum compression service, according to one example. FIG. 5 illustrates a computing system 118 in which examples may be practiced. The computing system 118 of FIG. 5 includes a communications network 120, through which a computing device 122 is communicatively coupled to a QCD computing device 124. In the example of FIG. 5, the computing device 122 is a classical computing device, while the QCD computing device 124 is a quantum computing device. Accordingly, the computing device 122 includes a system memory 126 communicatively coupled to a processor device 128, while the QCD computing device 124 includes a system memory 130 communicatively coupled to a quantum processor device 132. The QCD computing device 124 maintains a set of one or more first qubits 134(0)-134(Q), which are in an state of entanglement with a set of one or more second qubits 136(0)-136(Q) that are maintained by a QCD computing device 138 (i.e., another quantum computing device) communicatively coupled to the QCD computing device 124.

As seen in FIG. 5, the computing device 122 of the computing system 118 of FIG. 5 generates a compressed file 140. To achieve even greater compression, the computing device 122 sends the compressed file 140 to the QCD computing device 124, which performs superdense encoding on the compressed file 140 using the one or more first qubits 134(0)-134(Q), as a non-limiting example. After performing the superdense encoding, the QCD computing device 124 sends the one or more first qubits 134(0)-134(Q) to the QCD computing device 138.

Figure 6:
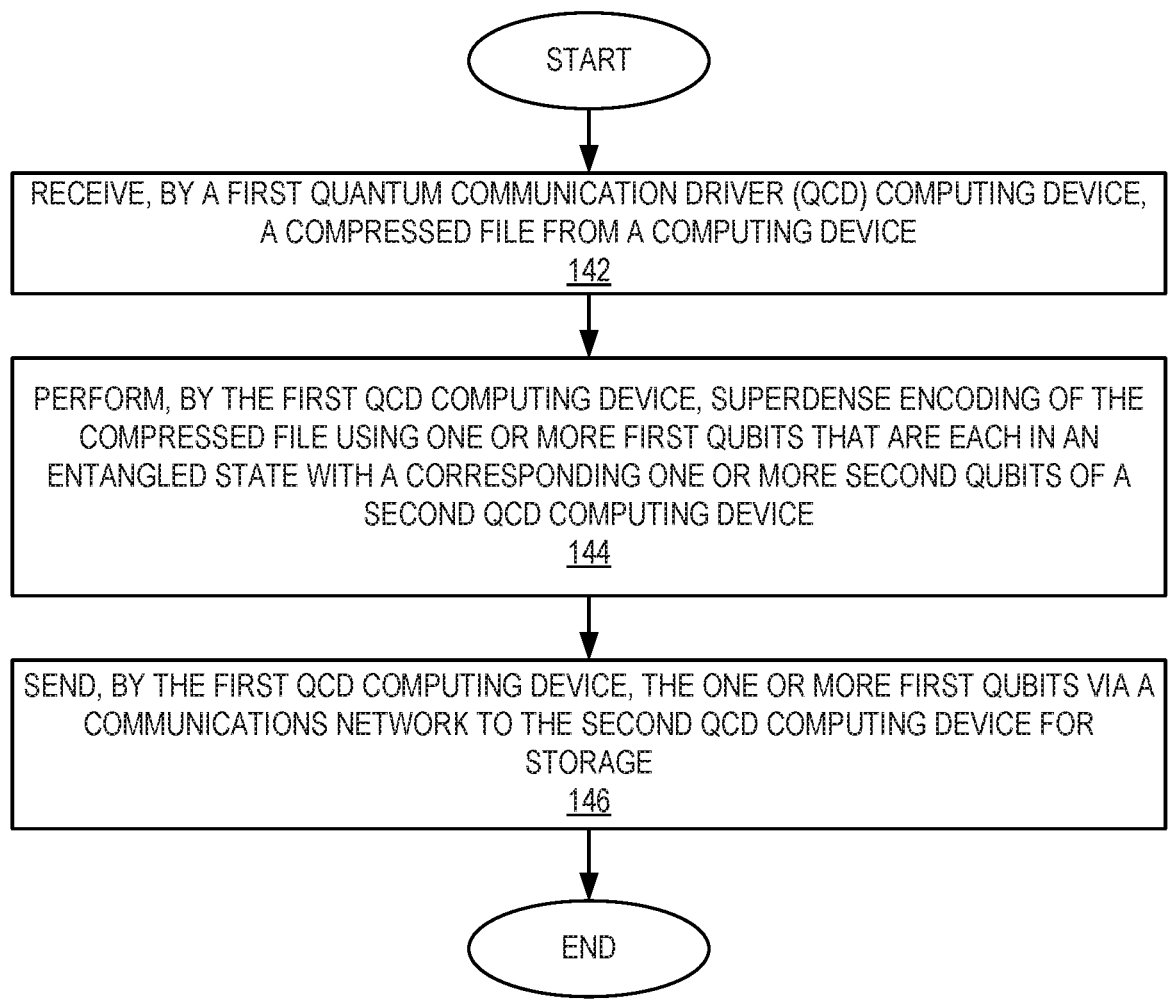
FIG. 6 is a flowchart of a simplified method for receiving and performing superdense encoding of a compressed file, according to one example.

FIG. 6 is a flowchart of a simplified method for receiving and performing superdense encoding of a compressed file, according to one example. For the sake of clarity, elements of FIG. 5 are referenced in describing FIG. 6. Operations in FIG. 6 begin with a first QCD computing device, such as the QCD computing device 124, receiving a compressed file 140 from a computing device 122 (block 142). The first QCD computing device 124 performs superdense encoding of the compressed file 140 using one or more first qubits 134(0)-134(Q) that are each in an entangled state with a corresponding one or more second qubits 136(0)-136(Q) of a second QCD computing device 138 (block 144). The first QCD computing device 124 then sends the one or more first qubits 134(0)-134(Q) via the communications network 120 to the second QCD computing device 138 for storage (block 146).

Figure 7:
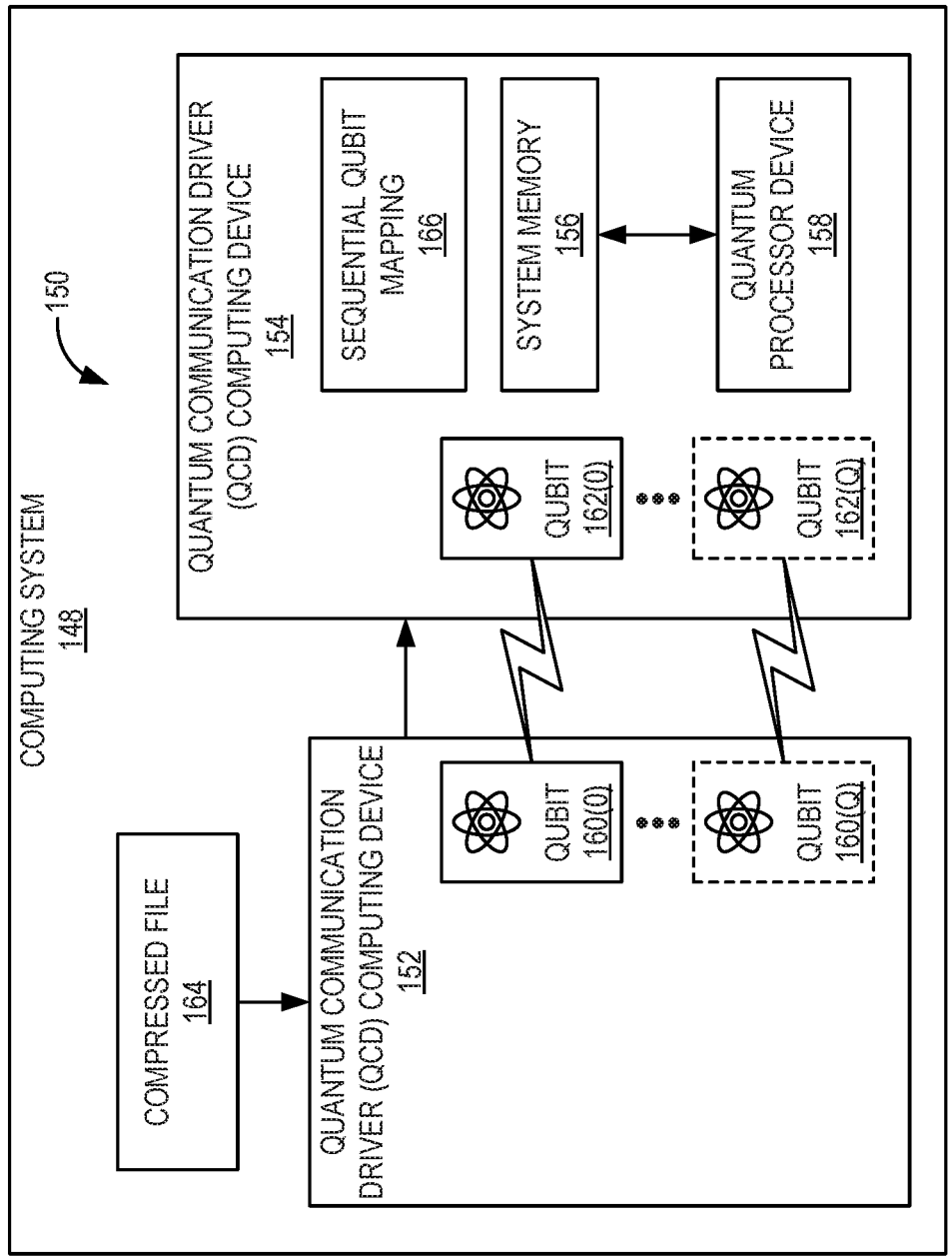
FIG. 7 is a simpler block diagram of the computing system of FIG. 1 for generating a sequential qubit mapping, according to one example.

FIG. 7 is a simpler block diagram of the computing system 10 of FIG. 1 for generating a sequential qubit mapping, according to one example. FIG. 7 illustrates a computing system 148 in which examples may be practiced. The computing system 148 of FIG. 7 includes a communications network 150, through which a QCD computing device 152 is communicatively coupled to a QCD computing device 154. As seen in FIG. 7, the QCD computing device 154 includes a system memory 156 communicatively coupled to a quantum processor device 158. The QCD computing device 152 maintains a set of one or more first qubits 160(0)-160(Q), which are in a state of entanglement with a set of one or more second qubits 162(0)-162(Q) that are maintained by the QCD computing device 154.

In the example of FIG. 7, after the QCD computing device 152 performs superdense encoding on a compressed file 164, the QCD computing device 154 receives the one or more first qubits 160(0)-160(Q) from the QCD computing device 152 via the communications network 150. The QCD computing device 154 next generates a sequential qubit mapping 166 that represents a sequence in which the one or more first qubits 160(0)-160(Q) encode the compressed file 164. The QCD computing device 154 then stores the one or more first qubits 160(0)-160(Q) in association with the sequential qubit mapping 166.

Figure 8:
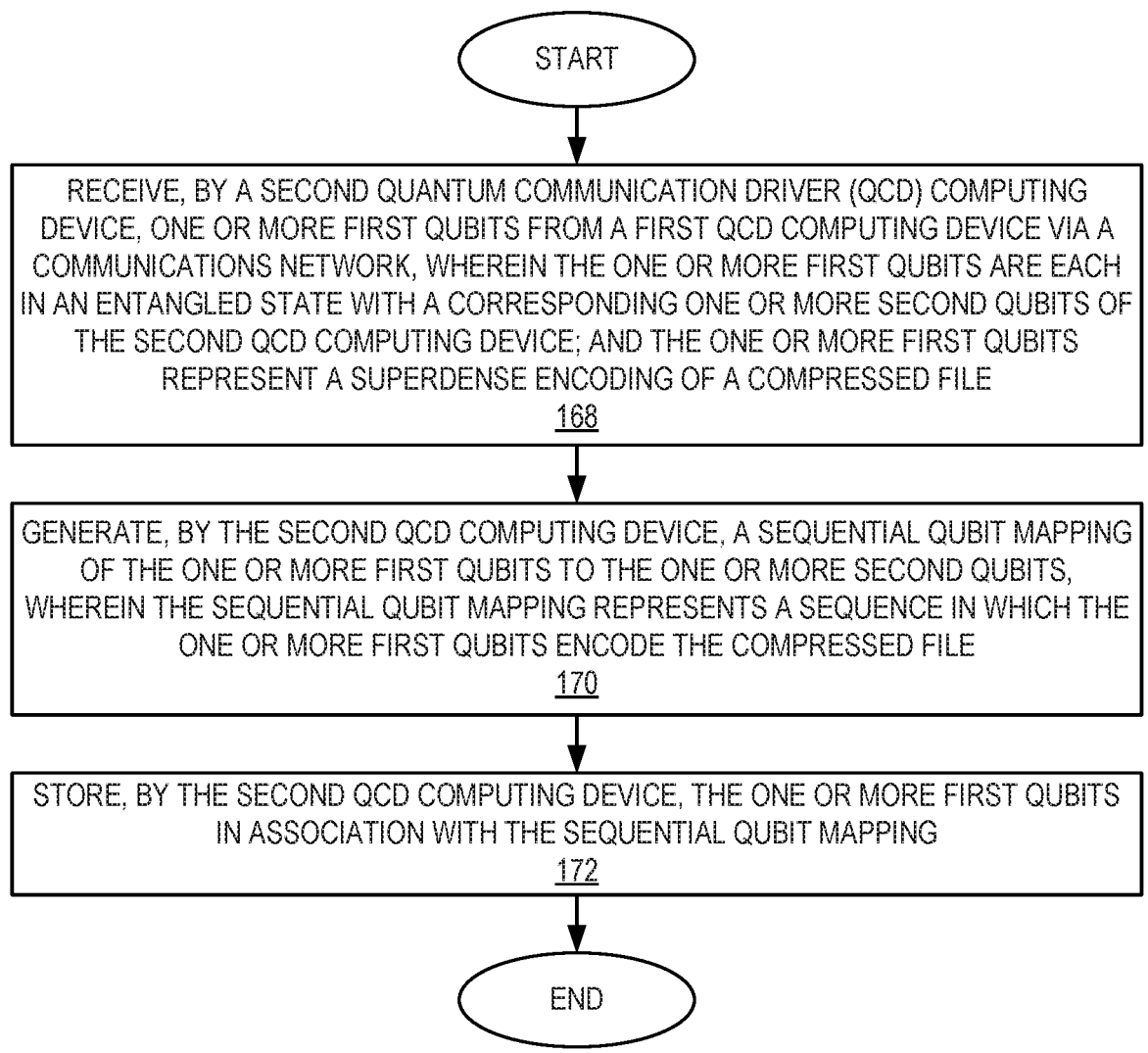
FIG. 8 is a flowchart of a simplified method for receiving qubits used in superdense encoding and generating a corresponding sequential qubit mapping, according to one example.

FIG. 8 is a flowchart of a simplified method for receiving qubits used in superdense encoding and generating a corresponding sequential qubit mapping, according to one example. Elements of FIG. 7 are referenced in describing FIG. 8, for the sake of clarity. In FIG. 8, a second QCD computing device, such as the QCD computing device 154, receives one or more first qubits 160(0)-160(Q) from a first QCD computing device, such as the QCD computing device 152, via the communications network 150, wherein the one or more first qubits 160(0)-160(Q) are each in an entangled state with a corresponding one or more second qubits 162(0)-162(Q) of the second QCD computing device 154, and the one or more first qubits 160(0)-160(Q) represent a superdense encoding of the compressed file 164 (block 168). The second QCD computing device 154 generates the sequential qubit mapping 166 of the one or more first qubits 160(0)-160(Q) to the one or more second qubits 162(0)-162(Q), wherein the sequential qubit mapping 166 represents a sequence in which the one or more first qubits 160(0)-160(Q) encode the compressed file 164 (block 170). The second QCD computing device 154 then stores the one or more first qubits 160(0)-160(Q) in association with the sequential qubit mapping 166 (block 172).

Figure 9:
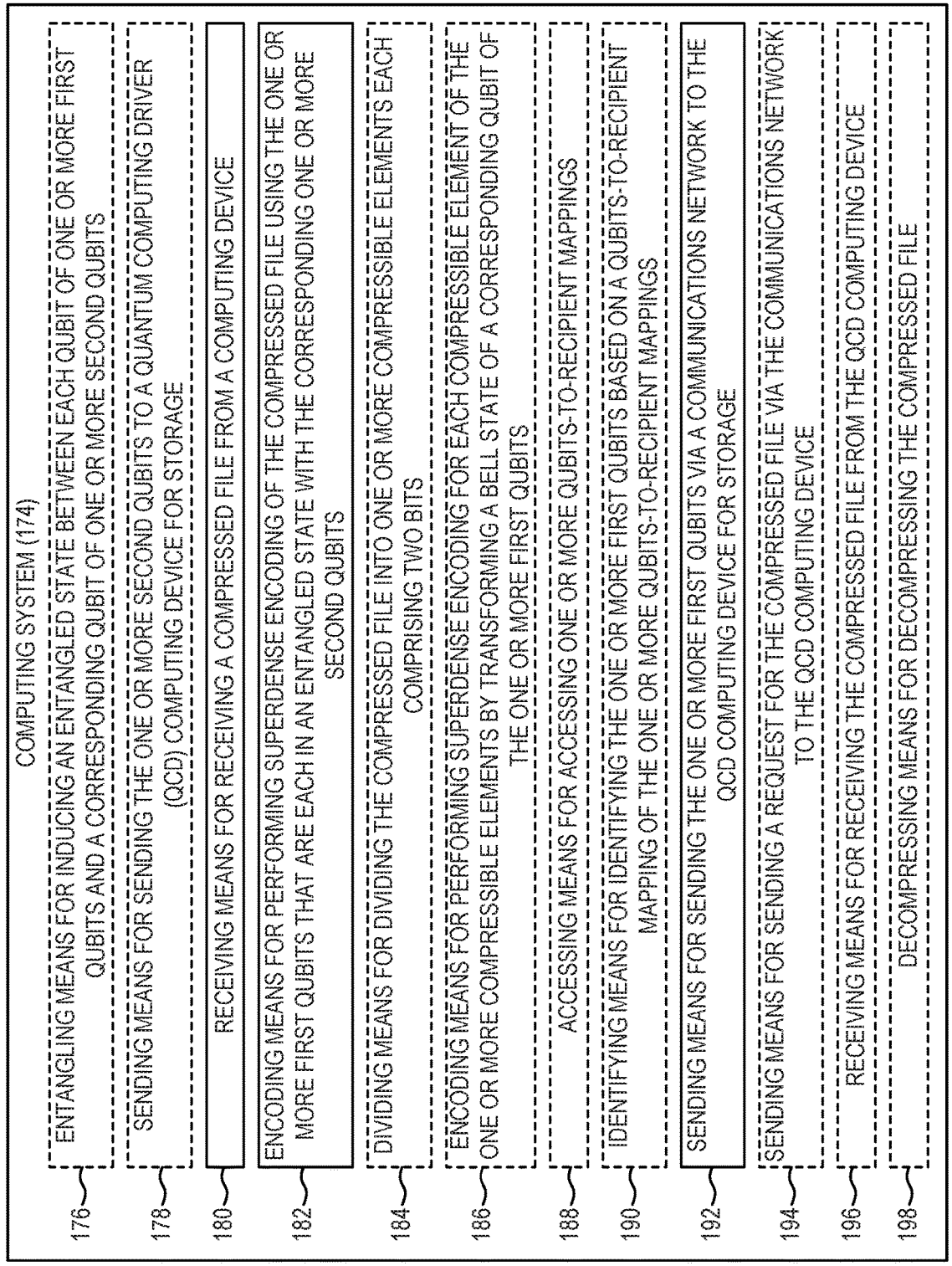
FIG. 9 is a block diagram of a computing system providing means suitable for implementing examples, according to one example.

FIG. 9 is a block diagram of a computing system 174 providing means suitable for implementing examples according to one example. The computing system 174 may include an entangling means 176 for inducing an entangled state between each qubit of one or more first qubits and a corresponding qubit of one or more second qubits. The computing system 174 may further include a sending means 178 for sending the one or more second qubits to the QCD computing device for storage. The computing system 174 also includes a receiving means 180 for receiving a compressed file from a computing device. The computing system 174 additionally includes an encoding means 182 for performing superdense encoding of the compressed file using the one or more first qubits that are each in an entangled state with the corresponding one or more second qubits. The computing system 174 may further include a dividing means 184 for dividing the compressed file into one or more compressible elements each comprising two bits. The computing system 174 may also include an encoding means 186 for performing superdense encoding for each compressible element of the one or more compressible elements by transforming a Bell state of a corresponding qubit of the one or more first qubits.

The computing system 174 may additionally include an accessing means 188 for accessing one or more qubits-to-recipient mappings. The computing system 174 may further include an identifying means 190 for identifying the one or more first qubits based on a qubits-to-recipient mapping of the one or more qubits-to-recipient mappings. The computing system 174 also includes a sending means 192 for sending the one or more first qubits via a communications network to the QCD computing device for storage. The computing system 174 may additionally include a sending means 194 for sending a request for the compressed file via the communications network to the QCD computing device. The computing system 174 may further include a receiving means 196 for receiving the compressed file from the QCD computing device. The computing system 174 may also include a decompressing means 198 for decompressing the compressed file.

Figure 10:
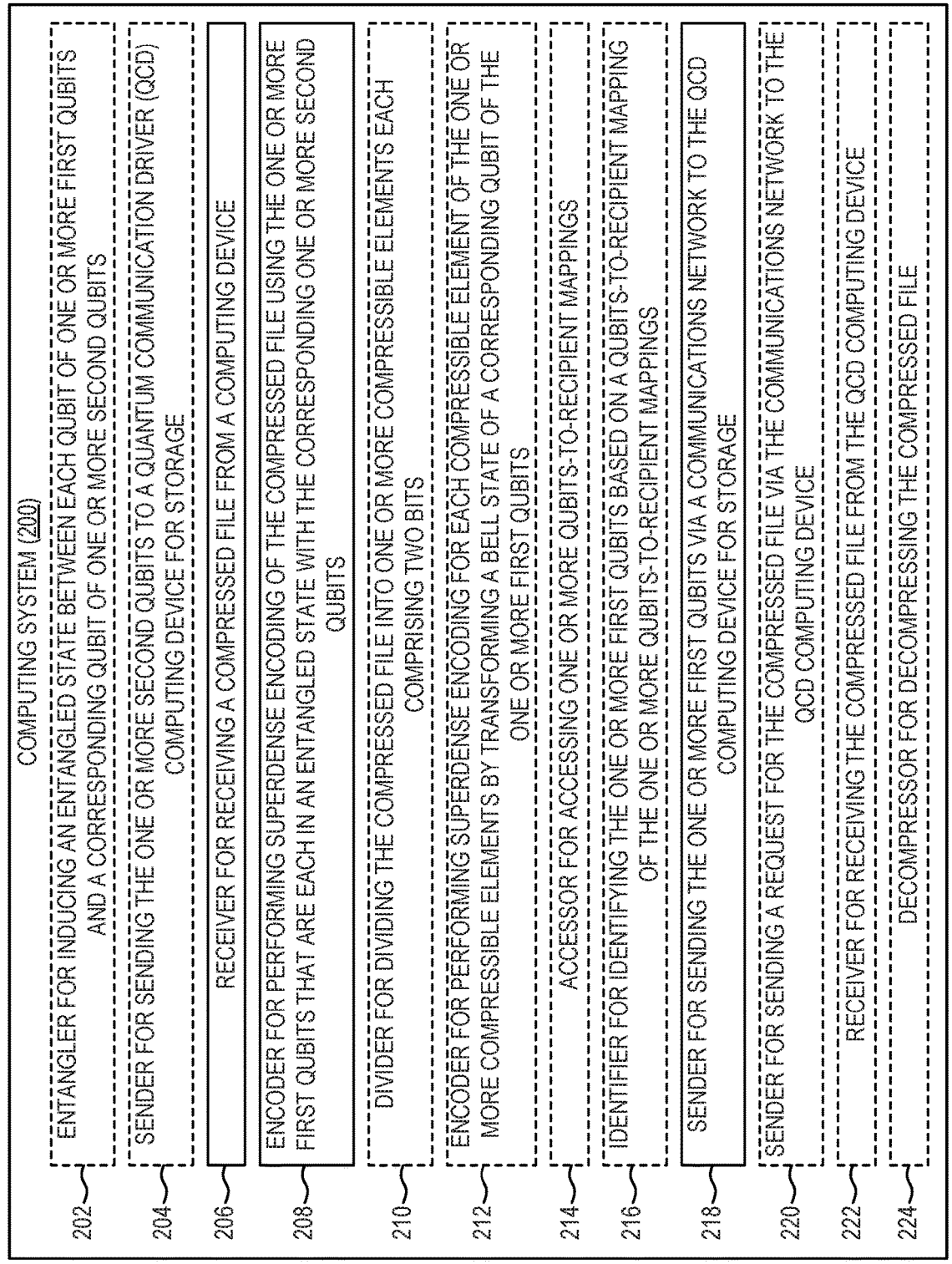
FIG. 10 is a block diagram of a computing system suitable for implementing examples, according to another example.

FIG. 10 is a block diagram of a computing system 200 suitable for implementing examples according to one example. The computing system 200 may include an entangler 202 for inducing an entangled state between each qubit of one or more first qubits and a corresponding qubit of one or more second qubits. The computing system may also include a sender 204 for sending the one or more second qubits to a QCD computing device for storage. The computing system 200 additionally includes a receiver 206 for receiving a compressed file from a computing device. The computing system 200 further includes an encoder 208 for performing superdense encoding of the compressed file using the one or more first qubits that are each in an entangled state with the corresponding one or more second qubits. The computing system 200 may also include a divider 210 for dividing the compressed file into one or more compressible elements each comprising two bits. The computing system 200 may additionally include an encoder 212 for performing superdense encoding for each compressible element of the one or more compressible elements by transforming a Bell state of a corresponding qubit of the one or more first qubits.

The computing system 200 may further include an accessor 214 for accessing one or more qubits-to-recipient mappings. The computing system 200 may also include an identifier 216 for identifying the one or more first qubits based on a qubits-to-recipient mapping of the one or more qubits-to-recipient mappings. The computing system 200 additionally includes a sender 218 for sending the one or more first qubits via a communications network to the QCD computing device for storage. The computing system 200 may further include a sender 220 for sending a request for the compressed file via the communications network to the QCD computing device. The computing system 200 may also include a receiver 222 for receiving the compressed file from the QCD computing device. The computing system 200 may additionally include a decompressor 224 for decompressing the compressed file.

Figure 11:
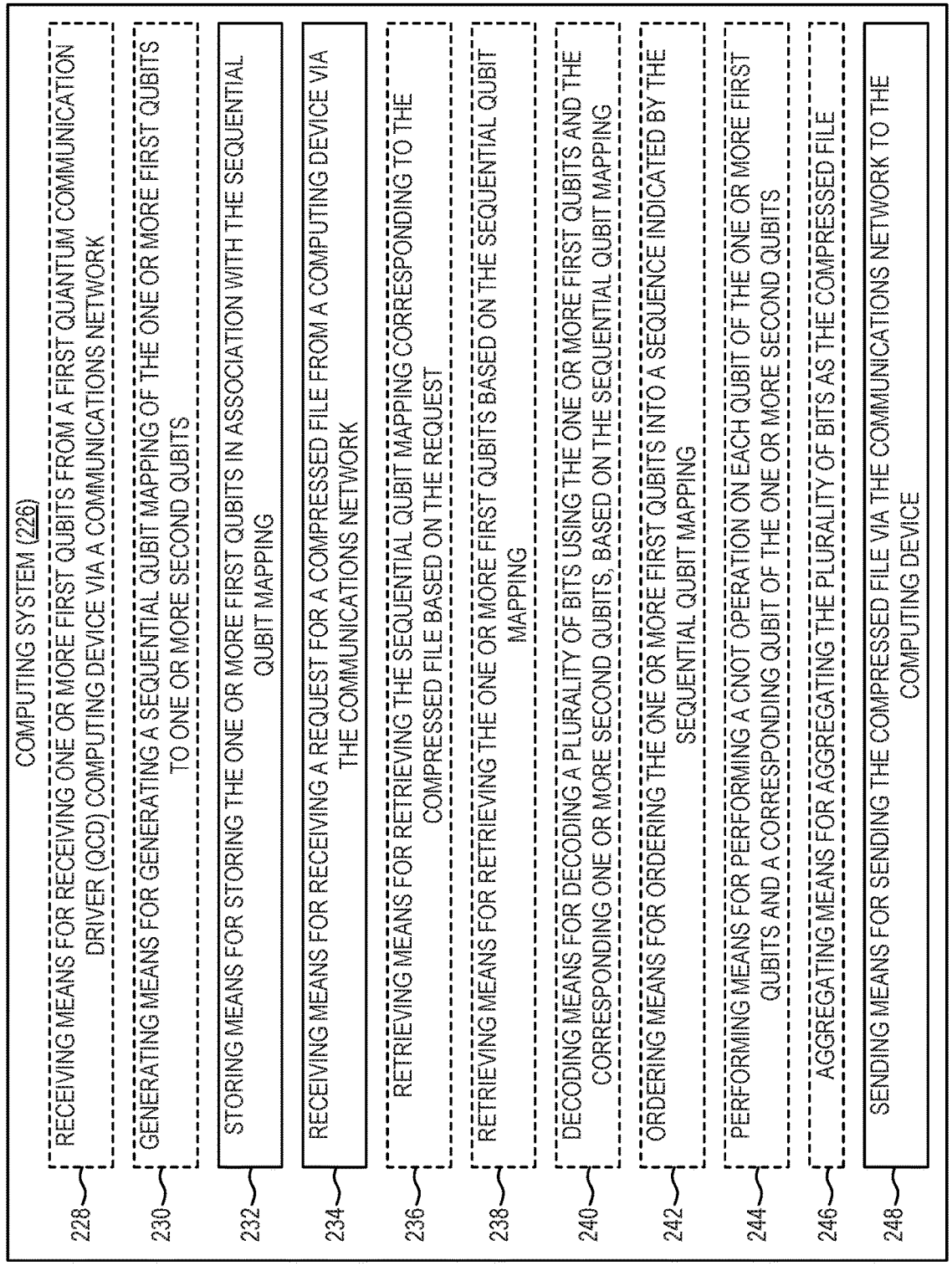
FIG. 11 is a block diagram of a computing system providing means suitable for implementing examples, according to another example.

FIG. 11 is a block diagram of a computing system 226 providing means suitable for implementing examples according to one example. The computing system 226 may include a receiving means 228 for receiving one or more first qubits from a first QCD computing device via a communications network. The computing system 226 may further include a generating means 230 for generating a sequential qubit mapping of the one or more first qubits to one or more second qubits. The computing system 226 also includes a storing means 232 for storing the one or more first qubits in association with the sequential qubit mapping. The computing system 226 additionally includes a receiving means 234 for receiving a request for a compressed file from a computing device via the communications network. The computing system 226 may further include a retrieving means 236 for retrieving the sequential qubit mapping corresponding to the compressed file based on the request. The computing system 226 may also include a retrieving means 238 for retrieving the one or more first qubits based on the sequential qubit mapping.

The computing system 226 may additionally include a decoding means 240 for decoding a plurality of bits using the one or more first qubits and the corresponding one or more second qubits, based on the sequential qubit mapping. The computing system 226 further may include an ordering means 242 for ordering the one or more first qubits into a sequence indicated by the sequential qubit mapping. The computing system 226 may also include a performing means 244 for performing a CNOT operation on each qubit of the one or more first qubits and a corresponding qubit of the one or more second qubits. The computing system 226 may additionally include an aggregating means 246 for aggregating the plurality of bits as the compressed file. The computing system 226 further includes a sending means 248 for sending the compressed file via the communications network to the computing device.

Figure 12:
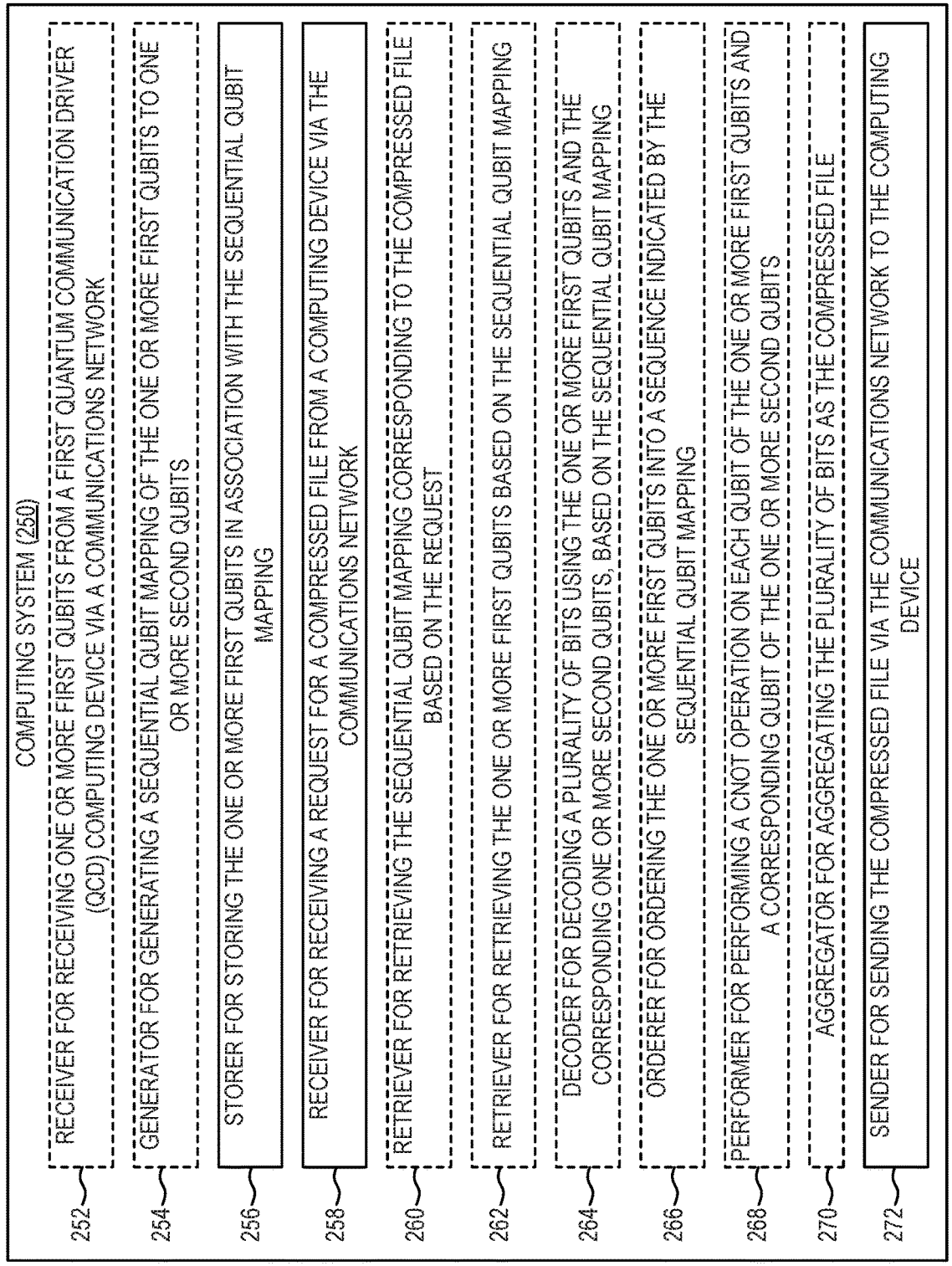
FIG. 12 is a block diagram of a computing system suitable for implementing examples, according to yet another example.

FIG. 12 is a block diagram of a computing system 250 suitable for implementing examples according to one example. The computing system 250 may include a receiver 252 for receiving one or more first qubits from a first QCD computing device via a communications network. The computing system 250 may further include a generator 254 for generating a sequential qubit mapping of the one or more first qubits to one or more second qubits. The computing system 250 also includes a storer 256 for storing the one or more first qubits in association with the sequential qubit mapping. The computing system 250 additionally includes a receiver 258 for receiving a request for a compressed file from a computing device via the communications network. The computing system 250 may further include a retriever 260 for retrieving the sequential qubit mapping corresponding to the compressed file based on the request. The computing system 250 may also include a retriever 262 for retrieving the one or more first qubits based on the sequential qubit mapping.

The computing system 250 may additionally include a decoder 264 for decoding a plurality of bits using the one or more first qubits and the corresponding one or more second qubits, based on the sequential qubit mapping. The computing system 250 may further include an orderer 266 for ordering the one or more first qubits into a sequence indicated by the sequential qubit mapping. The computing system 250 may also include a performer 268 for performing a CNOT operation on each qubit of the one or more first qubits and a corresponding qubit of the one or more second qubits. The computing system 250 may additionally include an aggregator 270 for aggregating the plurality of bits as the compressed file. The computing system 250 further includes a sender 272 for sending the compressed file via the communications network to the computing device.

Figure 13:
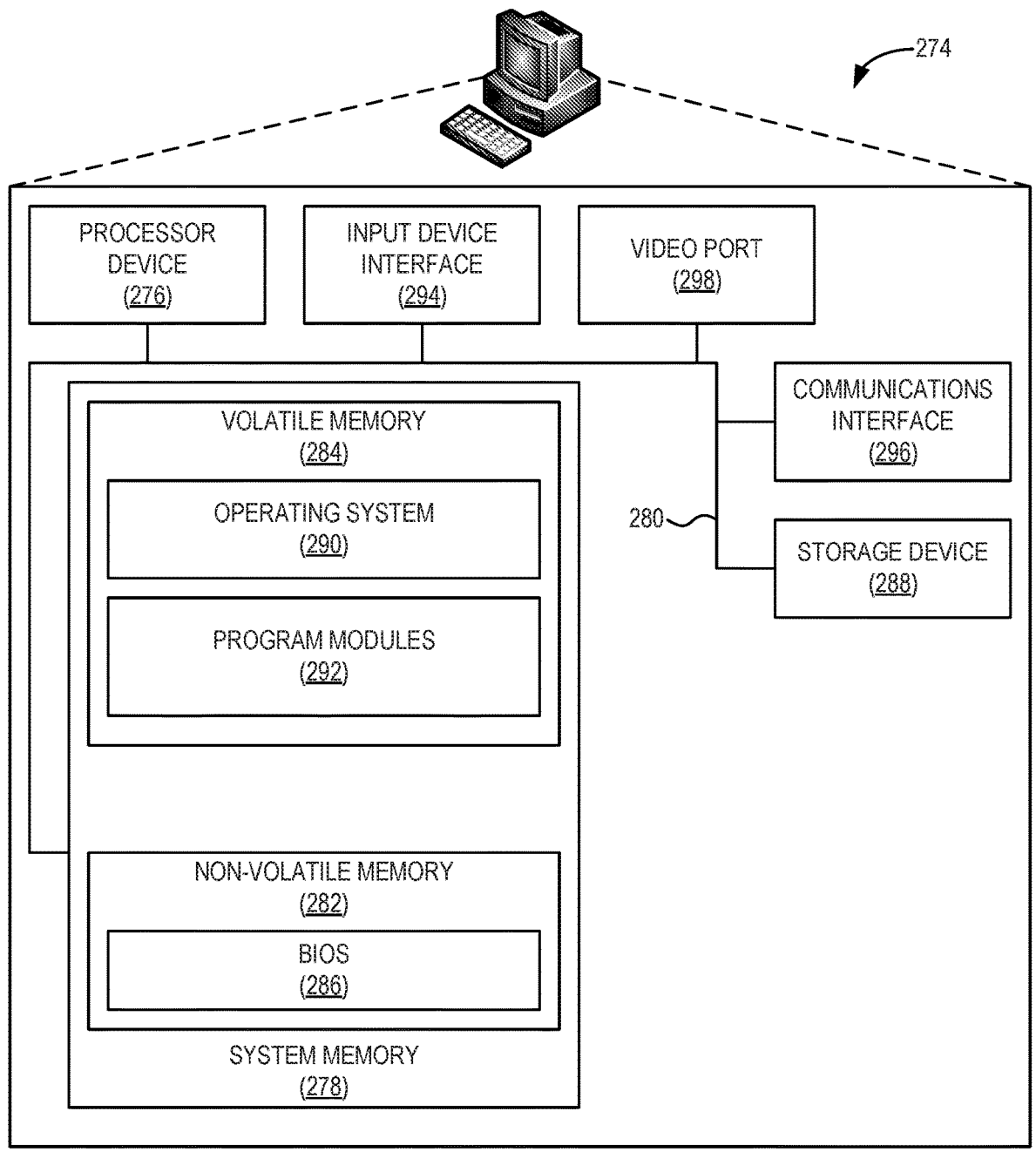
FIG. 13 is a block diagram of a computing device suitable for implementing examples, according to one example.

FIG. 13 is a block diagram of a processor-based computing device 274 ("computing device 274" or "classical computing device 274"), such as the computing device 14 of FIG. 1, suitable for implementing examples according to one example. The computing device 274 may comprise any computing or electronic device capable of including firmware, hardware, and/or executing software instructions to implement the functionality described herein, such as a computer server, a desktop computing device, a laptop computing device, a smartphone, a computing tablet, or the like. The computing device 274 includes a processor device 276, a system memory 278, and a system bus 280. The system bus 280 provides an interface for system components including, but not limited to, the system memory 278 and the processor device 276. The processor device 276 can be any commercially available or proprietary processor.

The system bus 280 may be any of several types of bus structures that may further interconnect to a memory bus (with or without a memory controller), a peripheral bus, and/or a local bus using any of a variety of commercially available bus architectures. The system memory 278 may include non-volatile memory 282 (e.g., read-only memory (ROM), erasable programmable ROM (EPROM), electrically EPROM (EEPROM), etc.), and volatile memory 284 (e.g., RAM). A basic input/output system (BIOS) 286 may be stored in the non-volatile memory 282 and can include the basic routines that help to transfer information among elements within the computing device 274. The volatile memory 284 may also include a high-speed RAM, such as static RAM, for caching data.

The computing device 274 may further include or be coupled to a non-transitory computer-readable storage medium such as a storage device 288, which may comprise, for example, an internal or external hard disk drive (HDD) (e.g., enhanced integrated drive electronics (EIDE) or serial advanced technology attachment (SATA)), HDD (e.g., EIDE or SATA) for storage, flash memory, or the like. The storage device 288 and other drives associated with computer-readable media and computer-usable media may provide non-volatile storage of data, data structures, computer-executable instructions, and the like. Although the description of computer-readable media above refers to an HDD, it should be appreciated that other types of media that are readable by a computer, such as Zip disks, magnetic cassettes, flash memory cards, cartridges, and the like, may also be used in the operating environment, and, further, that any such media may contain computer-executable instructions for performing novel methods of the disclosed examples.

A number of modules can be stored in the storage device 288 and in the volatile memory 284, including an operating system 290 and one or more program modules 292 which may implement the functionality described herein in whole or in part. It is to be appreciated that the examples can be implemented with various commercially available operating systems 290 or combinations of operating systems 290. All or a portion of the examples may be implemented as a computer program product stored on a transitory or non-transitory computer-usable or computer-readable storage medium, such as the storage device 288, which includes complex programming instructions, such as complex computer-readable program code, to cause the processor device 276 to carry out the steps described herein. Thus, the computer-readable program code can comprise software instructions for implementing the functionality of the examples described herein when executed on the processor device 276. The processor device 276 may serve as a controller, or control system, for the computing device 274 that is to implement the functionality described herein.

An operator may also be able to enter one or more configuration commands through a keyboard (not illustrated), a pointing device such as a mouse (not illustrated), or a touch-sensitive surface such as a display device (not illustrated). Such input devices may be connected to the processor device 276 through an input device interface 294 that is coupled to the system bus 280 but can be connected by other interfaces, such as a parallel port, an Institute of Electrical and Electronic Engineers (IEEE) 1394 serial port, a Universal Serial Bus (USB) port, an IR interface, and the like.

The computing device 274 may also include a communications interface 296 suitable for communicating with a network as appropriate or desired. The computing device 274 may also include a video port 298 to interface with a display device to provide information to a user.

Figure 14:
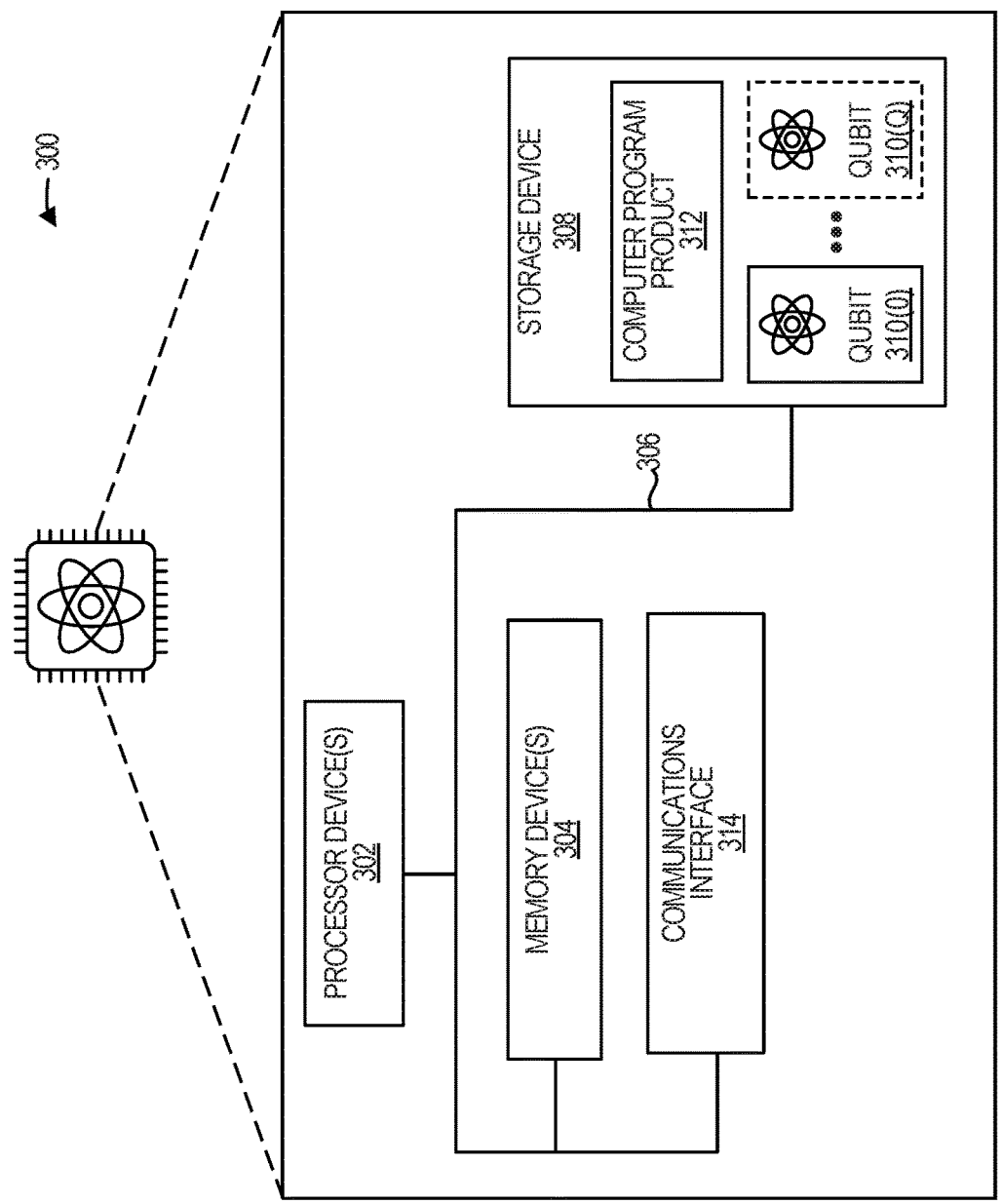
FIG. 14 is a block diagram of a quantum computing device suitable for implementing examples, according to one example.

FIG. 14 is a block diagram of a quantum computing device 300, such as the QCD computing device 16 and the QCD computing device 22 of FIG. 1, suitable for implementing examples according to one example. The quantum computing device 300 may comprise any computing or electronic device capable of including firmware, hardware, and/or executing software instructions to implement the functionality described herein in a quantum environment. The quantum computing device 300 includes the one or more processor devices 302, one or more memory devices 304, and a system bus 306. The system bus 306 provides an interface for system components including, but not limited to, the one or more memory devices 304 and the one or more processor devices 302. The processor devices 302 can be any commercially available or proprietary processor suitable for operating in a quantum environment. The quantum computing device 300 may further include or be coupled to a non-transitory computer-readable storage medium such as a storage device 308. The storage device 308 and other drives associated with computer-readable media and computer-usable media may provide non-volatile storage of data, data structures, computer-executable instructions, and the like. The storage device 308 may also store one or more qubits 310(0)-310(Q), which may be measured and/or manipulated by the one or more processor devices 302 when performing quantum computing operations.

All or a portion of the examples may be implemented as a computer program product 312 stored on a transitory or non-transitory computer-usable or computer-readable storage medium, such as the storage device 308, which includes complex programming instructions, such as complex computer-readable program code, to cause the one or more processor devices 302 to carry out the steps described herein. Thus, the computer-readable program code can comprise software instructions for implementing the functionality of the examples described herein when executed on the one or more processor devices 302.

An operator may also be able to enter one or more configuration commands through a keyboard (not illustrated), a pointing device such as a mouse (not illustrated), or a touch-sensitive surface. The quantum computing device 300 may also include a communications interface 314 suitable for communicating with other computing devices, including, in some implementations, classical computing devices.

The examples also facilitate an improvement to computer functionality itself via quantum compression using QCD computing devices to selectively perform superdense encoding of compressed files, resulting in improved capacity of computer devices serving as file storage on the communications network. Thus, the examples are directed to specific improvements in computer functionality.

Other computing system designs and configurations may also be suitable to implement the systems, apparatus, and methods described herein. The following examples illustrate various implementations in accordance with one or more aspects of the present disclosure.

Example 1 is a method comprising: receiving, by a first QCD computing device, a compressed file from a computing device; performing, by the first QCD computing device, superdense encoding of the compressed file using one or more first qubits that are each in an entangled state with a corresponding one or more second qubits of a second QCD computing device; and sending the one or more first qubits via a communications network to the second QCD computing device for storage.

Example 2 is the method of example 1, further comprising, prior to receiving the compressed file: inducing the entangled state between each qubit of the one or more first qubits and a corresponding qubit of the one or more second qubits; and sending the one or more second qubits to the second QCD computing device for storage.

Example 3 is the method of example 1, wherein performing the superdense encoding of the compressed file comprises: dividing the compressed file into one or more compressible elements each comprising two bits; and performing superdense encoding for each compressible element of the one or more compressible elements by transforming a Bell state of a corresponding qubit of the one or more first qubits.

Example 4 is the method of example 1, wherein performing the superdense encoding of the compressed file comprises: accessing, from a qubit router of the first QCD computing device, one or more qubits-to-recipient mappings; and identifying the one or more first qubits based on a qubits-to-recipient mapping of the one or more qubits-to-recipient mappings.

Example 5 is the method of example 1, wherein the compressed file is compressed using one of 7Z, TAR.BZ2, TAR.GZ, RAR, or ZIP formats.

Example 6 is the method of example 1, further comprising: sending, by the computing device, a request for the compressed file via the communications network to the second QCD computing device; receiving, by the computing device, the compressed file from the second QCD computing device; and decompressing, by the computing device, the compressed file.

Example 7 is the method of example 6, wherein decompressing the compressed file comprises decompressing the compressed file using one of 7Z, TAR.BZ2, TAR.GZ, RAR, or ZIP formats.

Example 8 is a method comprising: receiving, by a second QCD computing device, one or more first qubits from a first QCD computing device via a communications network, wherein: the one or more first qubits are each in an entangled state with a corresponding one or more second qubits of the second QCD computing device; and the one or more first qubits represent a superdense encoding of a compressed file; generating, by the second QCD computing device, a sequential qubit mapping of the one or more first qubits to the one or more second qubits, wherein the sequential qubit mapping represents a sequence in which the one or more first qubits encode the compressed file; and storing, by the second QCD computing device, the one or more first qubits in association with the sequential qubit mapping.

Example 9 is the method of example 8, further comprising: receiving, by the second QCD computing device, a request for the compressed file from a computing device via the communications network; retrieving, by the second QCD computing device, the sequential qubit mapping corresponding to the compressed file based on the request; retrieving, by the second QCD computing device, the one or more first qubits based on the sequential qubit mapping; decoding, by the second QCD computing device, a plurality of bits using the one or more first qubits and the corresponding one or more second qubits, based on the sequential qubit mapping; aggregating the plurality of bits as the compressed file; and sending, by the second QCD computing device, the compressed file via the communications network to the computing device.

Example 10 is the method of example 9, wherein decoding the plurality of bits of the compressed file using the one or more first qubits and the corresponding one or more second qubits based on the sequential qubit mapping comprises: ordering the one or more first qubits into a sequence indicated by the sequential qubit mapping; and performing a CNOT operation on each qubit of the one or more first qubits and a corresponding qubit of the one or more second qubits.

Example 11 is a computing system, comprising: a means for receiving a compressed file from a computing device; a means for performing superdense encoding of the compressed file using one or more first qubits that are each in an entangled state with a corresponding one or more second qubits; and a means for sending the one or more first qubits via a communications network to a QCD computing device for storage.

Example 12 is the computing system of example 11, further comprising: a means for inducing the entangled state between each qubit of the one or more first qubits and a corresponding qubit of the one or more second qubits; and a means for sending the one or more second qubits to the QCD computing device for storage.

Example 13 is the computing system of example 11, wherein the means for performing the superdense encoding of the compressed file comprises: a means for dividing the compressed file into one or more compressible elements each comprising two bits; and a means for performing superdense encoding for each compressible element of the one or more compressible elements by transforming a Bell state of a corresponding qubit of the one or more first qubits.

Example 14 is the computing system of example 11, wherein the means for performing the superdense encoding of the compressed file comprises: a means for accessing one or more qubits-to-recipient mappings; and a means for identifying the one or more first qubits based on a qubits-to-recipient mapping of the one or more qubits-to-recipient mappings.

Example 15 is the computing system of example 11, further comprising: a means for sending a request for the compressed file via the communications network to the QCD computing device; a means for receiving the compressed file from the QCD computing device; and a means for decompressing the compressed file.

Example 16 is the computing system of example 15, wherein the means for decompressing the compressed file comprises a means for decompressing the compressed file using one of 7Z, TAR.BZ2, TAR.GZ, RAR, or ZIP formats.

Example 17 is a computing system comprising: a means for receiving one or more first qubits from a first QCD computing device via a communications network, wherein: the one or more first qubits are each in an entangled state with a corresponding one or more second qubits; and the one or more first qubits represent a superdense encoding of a compressed file; a means for generating a sequential qubit mapping of the one or more first qubits to the one or more second qubits, wherein the sequential qubit mapping represents a sequence in which the one or more first qubits encode the compressed file; and a means for storing the one or more first qubits in association with the sequential qubit mapping.

Example 18 is the computing system of example 17, further comprising: a means for receiving a request for the compressed file from a computing device via the communications network; a means for retrieving the sequential qubit mapping corresponding to the compressed file based on the request; a means for retrieving the one or more first qubits based on the sequential qubit mapping; a means for decoding a plurality of bits using the one or more first qubits and the corresponding one or more second qubits, based on the sequential qubit mapping; a means for aggregating the plurality of bits as the compressed file; and a means for sending the compressed file via the communications network to the computing device.

Example 19 is the computing system of example 18, wherein the means for decoding the plurality of bits of the compressed file using the one or more first qubits and the corresponding one or more second qubits based on the sequential qubit mapping comprises: a means for ordering the one or more first qubits into a sequence indicated by the sequential qubit mapping; and a means for performing a CNOT operation on each qubit of the one or more first qubits and a corresponding qubit of the one or more second qubits.

Example 20 is a computer program product stored on a non-transitory computer-readable storage medium and including instructions to cause a processor device to: receive a compressed file from a computing device; perform superdense encoding of the compressed file using one or more first qubits that are each in an entangled state with a corresponding one or more second qubits; and send the one or more first qubits via a communications network to a QCD computing device for storage.

Example 21 is the computer program product of example 20, further including instructions to cause the processor device to: induce the entangled state between each qubit of the one or more first qubits and a corresponding qubit of the one or more second qubits; and send the one or more second qubits to the QCD computing device for storage.

Example 22 is computer program product of example 20, wherein to perform the superdense encoding of the compressed file is to: divide the compressed file into one or more compressible elements each comprising two bits; and perform superdense encoding for each compressible element of the one or more compressible elements by transforming a Bell state of a corresponding qubit of the one or more first qubits.

Example 23 is the computer program product of example 20, wherein to perform the superdense encoding of the compressed file is to: access one or more qubits-to-recipient mappings; and identify the one or more first qubits based on a qubits-to-recipient mapping of the one or more qubits-to-recipient mappings.

Example 24 is the computer program product of example 20, wherein the compressed file is compressed using one of 7Z, TAR.BZ2, TAR.GZ, RAR, or ZIP formats.

Example 25 is the computer program product of example 20, further including instructions to cause the processor device to: send a request for the compressed file via the communications network to the QCD computing device; receive the compressed file from the QCD computing device; and decompress the compressed file.

Example 26 is the computer program product of example 25, wherein to decompress the compressed file is to decompress the compressed file using one of 7Z, TAR.BZ2, TAR.GZ, RAR, or ZIP formats.

Example 27 is a computer program product stored on a non-transitory computer-readable storage medium and including instructions to cause a processor device to: receive one or more first qubits from a first QCD computing device via a communications network, wherein: the one or more first qubits are each in an entangled state with a corresponding one or more second qubits; and the one or more first qubits represent a superdense encoding of a compressed file; generating a sequential qubit mapping of the one or more first qubits to the one or more second qubits, wherein the sequential qubit mapping represents a sequence in which the one or more first qubits encode the compressed file; and store the one or more first qubits in association with the sequential qubit mapping.

Example 28 is the computer program product of example 27, further including instructions to cause the processor device to: receive a request for the compressed file from a computing device via the communications network; retrieve the sequential qubit mapping corresponding to the compressed file based on the request; retrieve the one or more first qubits based on the sequential qubit mapping; decode a plurality of bits using the one or more first qubits and the corresponding one or more second qubits, based on the sequential qubit mapping; aggregate the plurality of bits as the compressed file; and send the compressed file via the communications network to the computing device.

Example 29 is the computer program product of example 28, wherein to decode the plurality of bits of the compressed file using the one or more first qubits and the corresponding one or more second qubits based on the sequential qubit mapping is to: order the one or more first qubits into a sequence indicated by the sequential qubit mapping; and perform a CNOT operation on each qubit of the one or more first qubits and a corresponding qubit of the one or more second qubits.

Example 30 is a computing system, comprising: a computing device, comprising: a system memory; and a processor device coupled to the system memory; and a first QCD computing device, comprising: a system memory; and a quantum processor device coupled to the system memory and implementing one or more first qubits, the quantum processor device to: receive a compressed file from the computing device; perform superdense encoding of the compressed file using the one or more first qubits that are each in an entangled state with a corresponding one or more second qubits of a second QCD computing device; and send the one or more first qubits via a communications network to the second QCD computing device for storage.

Example 31 is the computing system of example 30, wherein the quantum processor device is further to: induce the entangled state between each qubit of the one or more first qubits and a corresponding qubit of the one or more second qubits; and send the one or more second qubits to the second QCD computing device for storage.

Example 32 is the computing system of example 30, wherein to perform the superdense encoding of the compressed file is to: divide the compressed file into one or more compressible elements each comprising two bits; and perform superdense encoding for each compressible element of the one or more compressible elements by transforming a Bell state of a corresponding qubit of the one or more first qubits.

Example 33 is the computing system of example 30, wherein to perform the superdense encoding of the compressed file is to: access one or more qubits-to-recipient mappings; and identify the one or more first qubits based on a qubits-to-recipient mapping of the one or more qubits-to-recipient mappings.

Example 34 is the computing system of example 30, wherein the compressed file is compressed using one of 7Z, TAR.BZ2, TAR.GZ, RAR, or ZIP formats.

Example 35 is the computing system of example 30, wherein the quantum processor device is further to: send a request for the compressed file via the communications network to the second QCD computing device; receive the compressed file from the second QCD computing device; and decompress the compressed file.

Example 36 is the computing system of example 35, wherein to decompress the compressed file is to decompress the compressed file using one of 7Z, TAR.BZ2, TAR.GZ, RAR, or ZIP formats.

Example 37 is a second QCD computing device, comprising: a system memory; and a quantum processor device coupled to the system memory and implementing one or more second qubits, the quantum processor device to: receive one or more first qubits from a first QCD computing device via a communications network, wherein: the one or more first qubits are each in an entangled state with the corresponding one or more second qubits of the second QCD computing device; and the one or more first qubits represent a superdense encoding of a compressed file; generating a sequential qubit mapping of the one or more first qubits to the one or more second qubits, wherein the sequential qubit mapping represents a sequence in which the one or more first qubits encode the compressed file; and store the one or more first qubits in association with the sequential qubit mapping.

Example 38 is the second QCD computing device of example 37, wherein the quantum processor device is further to: receive a request for the compressed file from a computing device via the communications network; retrieve the sequential qubit mapping corresponding to the compressed file based on the request; retrieve the one or more first qubits based on the sequential qubit mapping; decode a plurality of bits using the one or more first qubits and the corresponding one or more second qubits, based on the sequential qubit mapping; aggregate the plurality of bits as the compressed file; and send the compressed file via the communications network to the computing device.

Example 39 is the second QCD computing device of example 38, wherein to decode the plurality of bits of the compressed file using the one or more first qubits and the corresponding one or more second qubits based on the sequential qubit mapping is to: order the one or more first qubits into a sequence indicated by the sequential qubit mapping; and perform a CNOT operation on each qubit of the one or more first qubits and a corresponding qubit of the one or more second qubits.

What is claimed is:

1. A method comprising:
   receiving, by a first quantum communication driver (QCD) computing device, a compressed file from a computing device;
   performing, by the first QCD computing device, superdense encoding of the compressed file using one or more first qubits that are each in an entangled state with a corresponding one or more second qubits of a second QCD computing device; and
   sending the one or more first qubits via a communications network to the second QCD computing device for storage.

2. The method of claim 1, further comprising, prior to receiving the compressed file:
   inducing the entangled state between each qubit of the one or more first qubits and a corresponding qubit of the one or more second qubits; and
   sending the one or more second qubits to the second QCD computing device for storage.

3. The method of claim 1, wherein performing the superdense encoding of the compressed file comprises:
   dividing the compressed file into one or more compressible elements each comprising two bits; and
   performing superdense encoding for each compressible element of the one or more compressible elements by transforming a Bell state of a corresponding qubit of the one or more first qubits.

4. The method of claim 1, wherein performing the superdense encoding of the compressed file comprises:
   accessing, from a qubit router of the first QCD computing device, one or more qubits-to-recipient mappings; and
   identifying the one or more first qubits based on a qubits-to-recipient mapping of the one or more qubits-to-recipient mappings.

5. The method of claim 1, wherein the compressed file is compressed using one of 7Z, TAR.BZ2, TAR.GZ, RAR, or ZIP formats.

6. The method of claim 1, further comprising:
   sending, by the computing device, a request for the compressed file via the communications network to the second QCD computing device;
   receiving, by the computing device, the compressed file from the second QCD computing device; and
   decompressing, by the computing device, the compressed file.

7. The method of claim 6, wherein decompressing the compressed file comprises decompressing the compressed file using one of 7Z, TAR.BZ2, TAR.GZ, RAR, or ZIP formats.

8. A method comprising:
   receiving, by a second quantum communication driver (QCD) computing device, one or more first qubits from a first QCD computing device via a communications network, wherein:
   the one or more first qubits are each in an entangled state with a corresponding one or more second qubits of the second QCD computing device; and
   the one or more first qubits represent a superdense encoding of a compressed file;
   generating, by the second QCD computing device, a sequential qubit mapping of the one or more first qubits to the one or more second qubits, wherein the sequential qubit mapping represents a sequence in which the one or more first qubits encode the compressed file; and
   storing, by the second QCD computing device, the one or more first qubits in association with the sequential qubit mapping.

9. The method of claim 8, further comprising:
   receiving, by the second QCD computing device, a request for the compressed file from a computing device via the communications network;
   retrieving, by the second QCD computing device, the sequential qubit mapping corresponding to the compressed file based on the request;
   retrieving, by the second QCD computing device, the one or more first qubits based on the sequential qubit mapping;
   decoding, by the second QCD computing device, a plurality of bits using the one or more first qubits and the corresponding one or more second qubits, based on the sequential qubit mapping;
   aggregating the plurality of bits as the compressed file; and
   sending, by the second QCD computing device, the compressed file via the communications network to the computing device.

10. The method of claim 9, wherein decoding the plurality of bits of the compressed file using the one or more first qubits and the corresponding one or more second qubits based on the sequential qubit mapping comprises:
    ordering the one or more first qubits into a sequence indicated by the sequential qubit mapping; and
    performing a CNOT operation on each qubit of the one or more first qubits and a corresponding qubit of the one or more second qubits.

11. A computing system, comprising:
    a computing device, comprising:
      a system memory; and
      a processor device coupled to the system memory; and
    a first quantum communication driver (QCD) computing device, comprising:
      a system memory; and
      a quantum processor device coupled to the system memory and implementing one or more first qubits, the quantum processor device to:
        receive a compressed file from the computing device;
        perform superdense encoding of the compressed file using the one or more first qubits that are each in an entangled state with a corresponding one or more second qubits of a second QCD computing device; and
        send the one or more first qubits via a communications network to the second QCD computing device for storage.

12. The computing system of claim 11, wherein the quantum processor device is further to:

induce the entangled state between each qubit of the one or more first qubits and a corresponding qubit of the one or more second qubits; and send the one or more second qubits to the second QCD computing device for storage.

13. The computing system of claim 11, wherein to perform the superdense encoding of the compressed file is to:

divide the compressed file into one or more compressible elements each comprising two bits; and perform superdense encoding for each compressible element of the one or more compressible elements by transforming a Bell state of a corresponding qubit of the one or more first qubits.

14. The computing system of claim 11, wherein:

the first QCD computing device further comprises a qubit router; and to perform the superdense encoding of the compressed file is to:

access, from the qubit router, one or more qubits-to-recipient mappings; and identify the one or more first qubits based on a qubits-to-recipient mapping of the one or more qubits-to-recipient mappings.

15. The computing system of claim 11, wherein the compressed file is compressed using one of 7Z, TAR.BZ2, TAR.GZ, RAR, or ZIP formats.

16. The computing system of claim 11, wherein the processor device of the computing device is to:

send a request for the compressed file via the communications network to the second QCD computing device;

receive the compressed file from the second QCD computing device; and decompress the compressed file.

17. The computing system of claim 16, wherein to decompress the compressed file is to decompress the compressed file using one of 7Z, TAR.BZ2, TAR.GZ, RAR, or ZIP formats.

18. The computing system of claim 11, wherein the second QCD computing device comprises:

a system memory; and a quantum processor device coupled to the system memory and implementing the one or more second qubits, the quantum processor device of the second QCD computing device to:

receive the one or more first qubits from the first QCD computing device via the communications network generate a sequential qubit mapping of the one or more first qubits to the one or more second qubits, wherein the sequential qubit mapping represents a sequence in which the one or more first qubits encode the compressed file; and store the one or more first qubits in association with the sequential qubit mapping.

19. The computing system of claim 18, wherein the quantum processor device of the second QCD computing device is further to:

receive a request for the compressed file from the computing device via the communications network;

retrieve the sequential qubit mapping corresponding to the compressed file based on the request;

retrieve the one or more first qubits based on the sequential qubit mapping;

decode a plurality of bits using the one or more first qubits and the corresponding one or more second qubits, based on the sequential qubit mapping;

aggregate the plurality of bits as the compressed file; and send the compressed file via the communications network to the computing device.

20. The computing system of claim 19, wherein to decode the plurality of bits of the compressed file using the one or more first qubits and the corresponding one or more second qubits based on the sequential qubit mapping is to:

order the one or more first qubits into a sequence indicated by the sequential qubit mapping; and perform a CNOT operation on each qubit of the one or more first qubits and a corresponding qubit of the one or more second qubits.

* * * * *